(12) United States Patent
Tsukada et al.

(10) Patent No.: US 9,343,208 B2
(45) Date of Patent: May 17, 2016

(54) CHIP RESISTOR AND MANUFACTURING METHOD THEREOF

(71) Applicant: ROHM CO., LTD., Kyoto (JP)

(72) Inventors: Torayuki Tsukada, Kyoto (JP); Kentaro Naka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/616,307

(22) Filed: Feb. 6, 2015

(65) Prior Publication Data
US 2015/0155081 A1 Jun. 4, 2015

Related U.S. Application Data

(62) Division of application No. 13/733,349, filed on Jan. 3, 2013, now Pat. No. 8,970,340.

(30) Foreign Application Priority Data

Jan. 6, 2012 (JP) .............................. 2012-001110
Dec. 4, 2012 (JP) .............................. 2012-264983

(51) Int. Cl.
| | |
|---|---|
| H01C 1/012 | (2006.01) |
| H01C 17/00 | (2006.01) |
| H01C 1/14 | (2006.01) |
| G01R 1/20 | (2006.01) |
| H01C 1/148 | (2006.01) |
| G01R 3/00 | (2006.01) |

(52) U.S. Cl.
CPC .............. *H01C 17/006* (2013.01); *G01R 1/203* (2013.01); *H01C 1/14* (2013.01); *H01C 1/148* (2013.01); *G01R 3/00* (2013.01); *Y10T 29/49082* (2015.01); *Y10T 156/1075* (2015.01)

(58) Field of Classification Search
CPC ......... H01C 1/14; H01C 1/148; H01C 17/006
USPC ....... 338/306–309, 22 R, 323–325, 329, 333; 29/610.1
See application file for complete search history.

(56) References Cited

U.S. PATENT DOCUMENTS

| | | |
|---|---|---|
| 5,170,146 A | 12/1992 | Gardner et al. |
| 7,053,749 B2 | 5/2006 | Ishida et al. |
| RE39,660 E * | 5/2007 | Szwarc .................. H01C 7/13 219/216 |
| 7,221,254 B2 | 5/2007 | Tsukada |
| 7,352,273 B2 | 4/2008 | Tanimura |

(Continued)

FOREIGN PATENT DOCUMENTS

JP         2004-063503         2/2004

*Primary Examiner* — Kyung Lee
(74) *Attorney, Agent, or Firm* — Hamre, Schumann, Mueller & Larson, P.C.

(57) ABSTRACT

A method of manufacturing a chip resistor includes forming a resistor assembly in which a conductive member including portions separated from each other in a first direction is provided in a resistance body member; and dividing the resistor assembly into chip resistors, each including a chip-shaped resistance body formed by a part of the resistance body member, a pair of main electrodes formed by a part of the conductive member and separated from each other in the first direction, and a pair of sub-electrodes formed by a part of the conductive member, separated from each other in the first direction, and adjacent to the main electrodes in a second direction perpendicular to the first direction with concave portions recessed in the first direction interposed therebetween, by punching.

16 Claims, 40 Drawing Sheets

(56) References Cited

U.S. PATENT DOCUMENTS

| | | |
|---|---|---|
| 8,432,248 B2 | 4/2013 | Sakai et al. |
| 8,531,264 B2 * | 9/2013 | Li .......................... H01C 7/06 338/195 |
| 8,779,887 B2 | 7/2014 | Lo et al. |
| 2005/0258930 A1 | 11/2005 | Ishida et al. |
| 2011/0063072 A1 * | 3/2011 | Lo .......................... H01C 1/148 338/314 |

* cited by examiner

CHIP RESISTOR AND MANUFACTURING METHOD THEREOF

CROSS-REFERENCE TO RELATED APPLICATIONS

This application is a Division of application Ser. No. 13/733,349, filed Jan. 3, 2013, which is based upon and claims the benefit of priority from Japanese Patent Application Nos. 2012-1110, filed on Jan. 6, 2012, and 2012-264983, filed on Dec. 4, 2012, the entire contents of which are incorporated herein by reference.

TECHNICAL FIELD

The present disclosure relates to a chip resistor and a manufacturing method thereof.

BACKGROUND

An example of a related art chip resistor includes four electrodes provided on a rectangular chip-shaped resistance body. In the related art chip resistor, the four electrodes are provided on one surface of the resistance body. A cross-shaped insulating layer is formed on a surface of the resistance body and the four electrodes are provided on the surface of the resistance body in a region where the insulating layer is not formed. In order to manufacture the chip resistor, a grid-type insulating layer is formed on the surface of the resistance body and a conductive member that constitutes the electrodes is formed in the remaining region of the surface to obtain a plate-shaped resistor assembly. Here, the dimension of the conductive member that constitutes the electrodes is defined by a relationship with the insulating layer. Then, the resistor assembly is cut in predetermined positions so that a plurality of chip resistors each having four electrodes are obtained.

The chip resistor having the four electrodes may be used as follows. Among the four electrodes, two electrodes (for example, two electrodes separated from each other in a longitudinal direction of the resistance body) are used as a pair of current electrodes (main electrodes) and remaining two electrodes are used as a pair of voltage electrodes (sub-electrodes). When a current of an electric circuit is detected, the pair of current electrodes is electrically connected to the electric circuit so that the current of the electric circuit flows to the pair of current electrodes. A voltage meter is connected to the pair of voltage electrodes. Since a resistance value of the chip resistor is already known, when voltage drop in the resistance body of the chip resistor is measured by using the voltage meter, it is possible to know a value of the current that flows to the resistance body by applying the measured value to the Ohm's equation. When the chip resistor is used, for example, the chip resistor is mounted on a circuit board. For example, the chip resistor is put on the circuit board so that the four electrodes are positioned on four conductive terminals formed on the circuit board and is soldered to be mounted on the circuit board.

However, in the above-described chip resistor, when the resistor assembly is cut to obtain the chip resistor, if cutting positions are shifted from desired positions, an error is generated in the dimension of the four electrodes of the chip resistor obtained by cutting the resistor assembly. For example, when an error is generated in a width of each of the electrodes, a resistance value of the resistance body sandwiched between the pair of current electrodes and the pair of voltage electrodes does not become a desired value and a value of a current measured by using the chip resistor becomes incorrect.

SUMMARY

The present disclosure provides some embodiments capable of efficiently manufacturing a chip resistor having four electrodes, which is suitable for removing or suppressing an error of a resistance value.

According to one embodiment of the present disclosure, provided is a method of manufacturing a chip resistor, including: forming a resistor assembly in which a conductive member including portions separated from each other in a first direction is provided in a resistance body member; and dividing the resistor assembly into chip resistors, each including a chip-shaped resistance body formed by a part of the resistance body member, a pair of main electrodes formed by a part of the conductive member and separated from each other in the first direction, and a pair of sub-electrodes formed by a part of the conductive member, separated from each other in the first direction, and adjacent to the main electrodes in a second direction perpendicular to the first direction with concave portions recessed in the first direction interposed therebetween, by punching.

The resistance body member has at least one elongated resistance body plate extended in the second direction, wherein the conductive member has a plurality of elongated conductive plates, each being extended in the second direction, and wherein the forming a resistor assembly includes: arranging the plurality of elongated conductive plates to be separated from each other in the first direction perpendicular to the second direction in which the elongated conductive plates are extended; arranging the elongated resistance body plate in a position sandwiched between adjacent two elongated conductive plates among the plurality of elongated conductive plates; and bonding the elongated resistance body plate and the adjacent elongated conductive plates.

The elongated resistance body plate and the adjacent elongated conductive plates are bonded to each other by welding.

In the method, a thickness of the elongated resistance body plate is smaller than that of the elongated conductive plate.

The resistance body member is plate-shaped, and the forming a resistor assembly includes forming an insulating layer extended in the second direction on one surface of the resistance body member; and forming the conductive member in a region where the insulating layer is not formed on the one surface by performing plating.

In the method, the forming a resistor assembly includes preparing a bonded body in which a plate-shaped resistance material and a plate-shaped conductive material are bonded to each other; and removing a part of the conductive material to form the conductive member including the portions separated from each other in the first direction.

In the method, in the dividing the resistor assembly into chip resistors, the resistor assembly is collectively divided into the plurality of chip resistors.

According to another embodiment of the present disclosure, provided is a chip resistor, including: a chip-shaped resistance body; a pair of main electrodes provided in the resistance body and separated from each other in a first direction; and a pair of sub-electrodes provided in the resistance body, separated from each other in the first direction, and separated from the main electrodes in a second direction perpendicular to the first direction, wherein the main electrodes and the sub-electrodes separated from each other in the second direction are adjacent to each other with concave portions recessed in the first direction interposed therebetween, wherein each of the main electrodes includes a main electrode first side edge positioned outside in the first direction; a main electrode second side edge positioned inside in the second direction; and a main electrode mount surface toward one side of a third direction perpendicular to both of the first and second directions, wherein each of the sub-electrodes includes a sub-electrode first side edge positioned outside in the first direction; a sub-electrode second side edge positioned inside in the second direction; and a sub-electrode mount surface toward the one side of the third direction, and wherein the chip resistor includes a main electrode first side surface extended from the main electrode first side edge toward the other side of the third direction, a main electrode second side surface extended from the main electrode second side edge toward the other side of the third direction, a main electrode first curved surface interposed between the main electrode first side surface and the main electrode second side surface, a sub-electrode first side surface extended from the sub-electrode first side edge toward the other side of the third direction, a sub-electrode second side surface extended from the sub-electrode second side edge toward the other side of the third direction, and a sub-electrode first curved surface interposed between the sub-electrode first side surface and the sub-electrode second side surface.

The main electrode mount surface includes a main electrode third side edge positioned outside in the second direction; a main electrode third side surface extended from the main electrode third side edge toward the other side of the third direction; and a main electrode second curved surface interposed between the main electrode first side surface and the main electrode third side surface.

The sub-electrode mount surface includes a sub-electrode third side edge positioned outside in the second direction; a sub-electrode third side surface extended from the sub-electrode third side edge toward the other side of the third direction; and a sub-electrode second curved surface interposed between the sub-electrode first side surface and the sub-electrode third side surface.

In the chip resistor, a dimension of the main electrode in the second direction is larger than that of the sub-electrode in the second direction.

The concave portion is positioned outside in the first direction in comparison with a boundary between the resistance body and the adjacent main electrode and the sub-electrode, when viewed from the third direction.

The concave portion is recessed inside in the first direction in comparison with a boundary between the resistance body and the adjacent main electrode and the sub-electrode, when viewed from the third direction.

The pair of main electrodes interposes the resistance body, and the pair of sub-electrodes interposes the resistance body.

In the chip resistor, a thickness of the resistance body is smaller than that of the main electrode and that of the sub-electrode.

The pair of main electrodes and the pair of sub-electrodes are provided on one surface of the resistance body in the third direction.

Each of the main electrode first side surface and the sub-electrode first side surface includes a fracture pattern surface.

In the fracture pattern surface, an end edge stretch portion stretched to an outside in the third direction is provided at an outer end in the third direction.

The main electrode second side surface and the sub-electrode second side surface are perpendicular to the second direction.

In the chip resistor, a distance between the main electrode second side surface and the sub-electrode second side surface becomes smaller from an outside in the first direction toward an inside in the first direction.

The main electrode second side surface and the sub-electrode second side surface are all curved surfaces.

The other features and advantages of the present disclosure will become more apparent from the following detailed description of the present disclosure, given with reference to the accompanying drawings.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Some embodiments of the present disclosure will now be described in detail with reference to the drawings. Meanwhile, for the convenience of description, an up and down direction will be specified with reference to FIG. 1.

FIGS. 1 to 8 illustrate a chip resistor 101 according to a first embodiment of the present disclosure. The chip resistor 101 according to the first embodiment includes a resistance body 1, a pair of main electrodes 2, and a pair of sub-electrodes 3.

Figure 1:
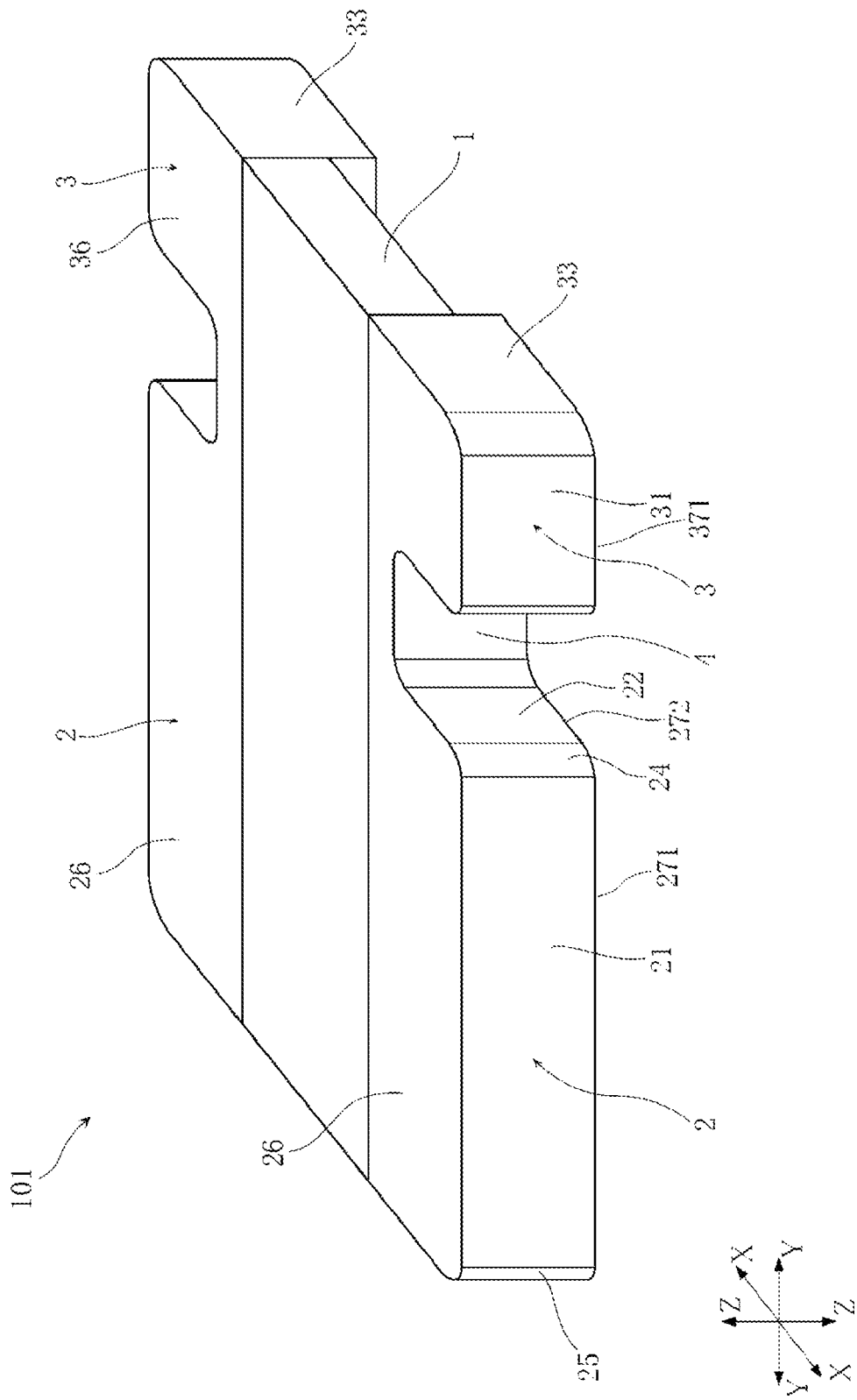
FIG. 1 is a perspective view of a chip resistor according to a first embodiment of the present disclosure.
Figure 2:
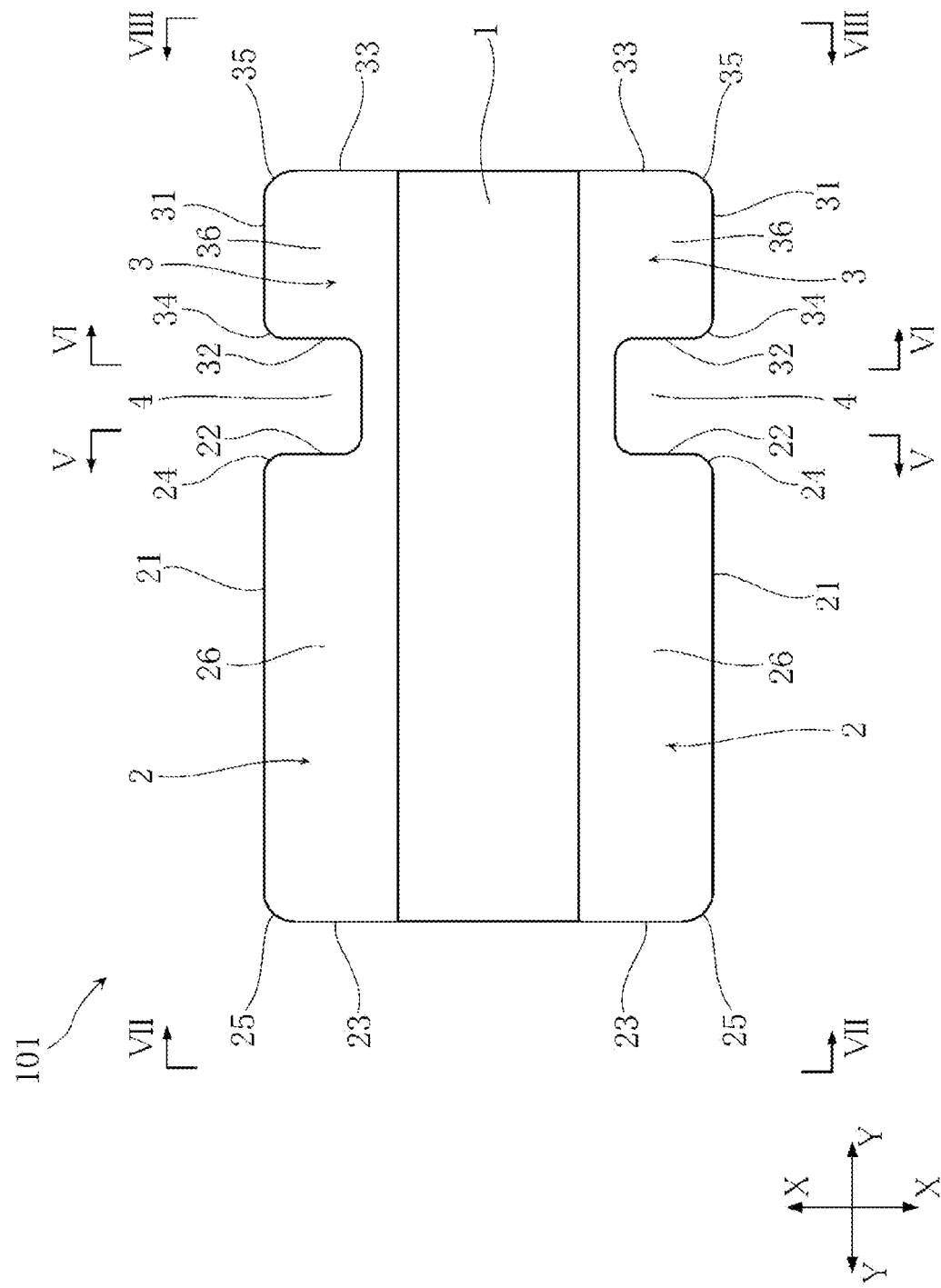
FIG. 2 is a plan view of the chip resistor illustrated in FIG. 1.

The resistance body 1 is in the form of an elongated rectangular chip when viewed from the Z direction of FIG. 1 and the thickness of the resistance body 1 in the Z direction is uniform. The resistance body 1 is formed of a resistance material such as Fe—Cr based alloy, a Ni—Cr based alloy, a Ni—Cu based alloy, or the like. However, the resistance body 1 is not limited thereto and a metal material having resistivity suitable for a size and a target resistance value of the chip resistor 101 may be properly used.

The pair of main electrodes 2 is formed of a conductive material, for example, Cu, Ni, or Fe. The pair of main electrodes 2 is separated from each other in the X direction with the resistance body 1 interposed therebetween. The resistance body 1 and the main electrodes 2 are bonded to each other, for example, by welding, as described later. The thicknesses of respective parts of the main electrodes 2 are uniform. The thickness of the main electrodes 2 is larger than that of the resistance body 1.

Each of the pair of main electrodes 2 has side surfaces 21, 22, and 23, curved surfaces 24 and 25, a top surface 26, and a bottom surface 27. The side surface 21 faces toward the X direction. The side surface 22 faces the adjacent sub-electrode 3 with a concave portion 4 to be described later interposed therebetween. The side surface 23 is positioned in the opposite direction to the adjacent sub-electrode 3. In the present embodiment, the side surfaces 22 and 23 face toward the Y direction that is perpendicular to the X direction. The top surface 26 and the bottom surface 27 face toward the Z direction that is perpendicular to both of the X and Y directions. In the present embodiment, the top surface 26 of the main electrode 2 is flush with a top surface 11 of the resistance body 1, and the bottom surface 27 of the main electrode 2 protrudes more than a bottom surface 12 of the resistance body 1. The bottom surface 27 of the main electrode 2 is a surface on which an object is to be mounted. The bottom surface 27 includes a side edge 271, a side edge 272, and a side edge 273. The side surface 21 is extended from the side edge 271 to a corresponding side edge of the top surface 26 along the Z direction. The side surface 22 is extended from the side edge 272 to a corresponding side edge of the top surface 26 along the Z direction. The side surface 23 is extended from the side edge 273 to a corresponding side edge of the top surface 26 along the Z direction.

The curved surface 24 is interposed between the side surfaces 21 and 22. The curved surface 25 is interposed between the side surfaces 21 and 23. These curved surfaces 24 and 25 are formed to correspond to a shape of a punching mold which is used when a resistor assembly is divided into the chip resistors 101 by punching, as described later. In practice, the curved surfaces 24 and 25 may have a smaller radius of curvature than that illustrated in the drawings.

Figure 3:
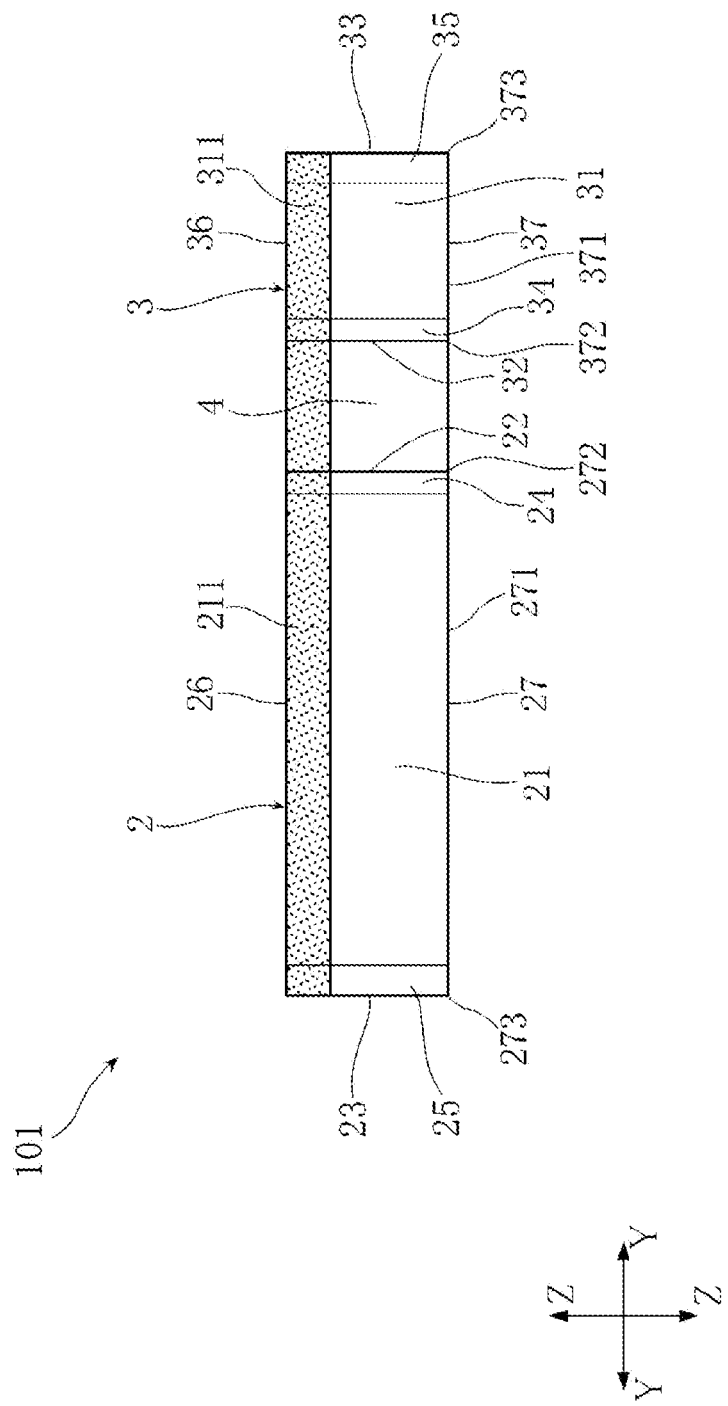
FIG. 3 is a front view of the chip resistor illustrated in FIG. 1.
Figure 4:
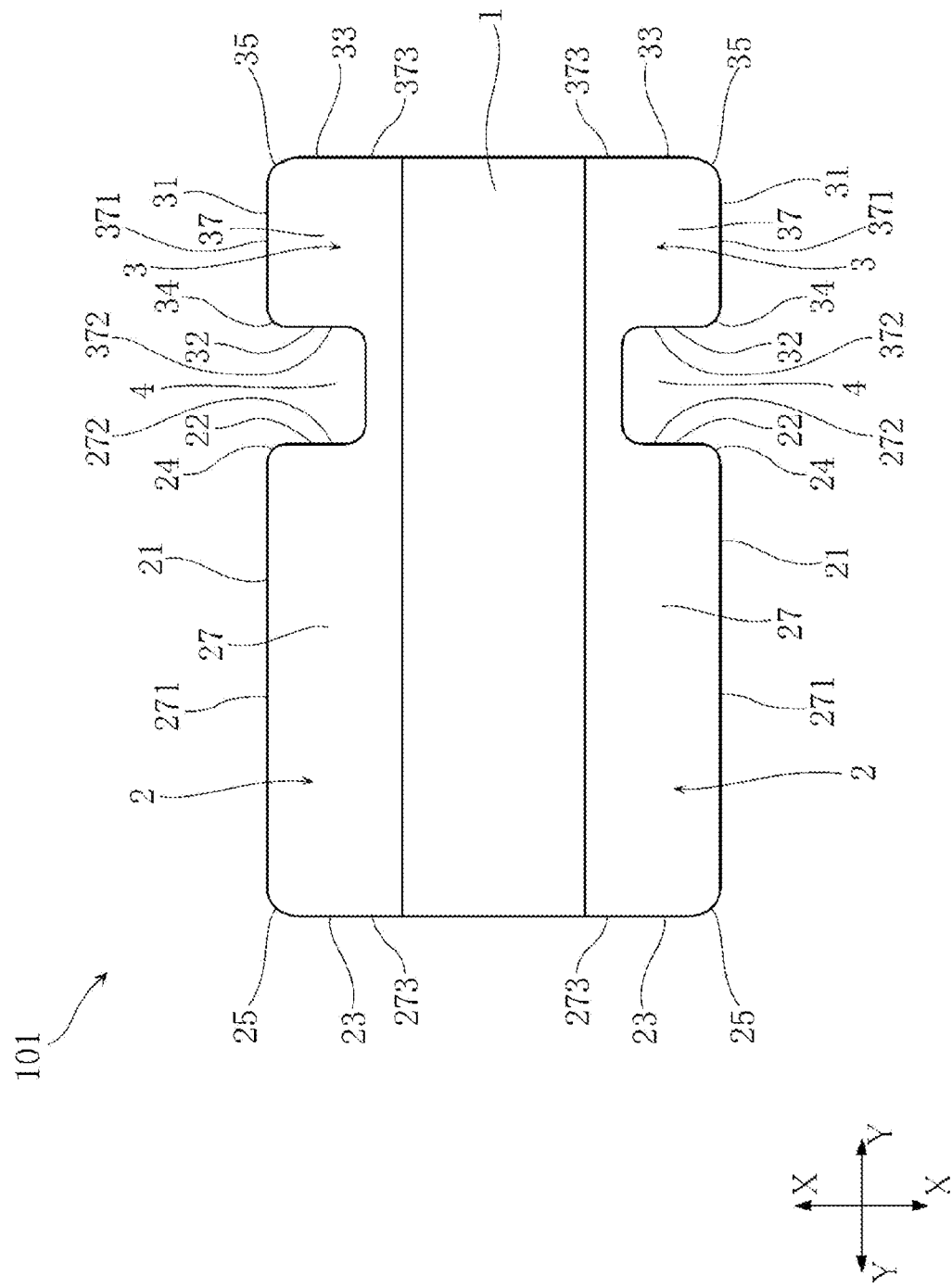
FIG. 4 is a bottom view of the chip resistor illustrated in FIG. 1.

As illustrated in FIG. 3, the side surface 21 has a fracture pattern surface 211 where the fracture patterns are formed. The fracture patterns have concavo-convex shapes formed when a metal is fractured. In the present embodiment, the fracture pattern surface 211 is positioned near the top surface 26.

Figure 5:
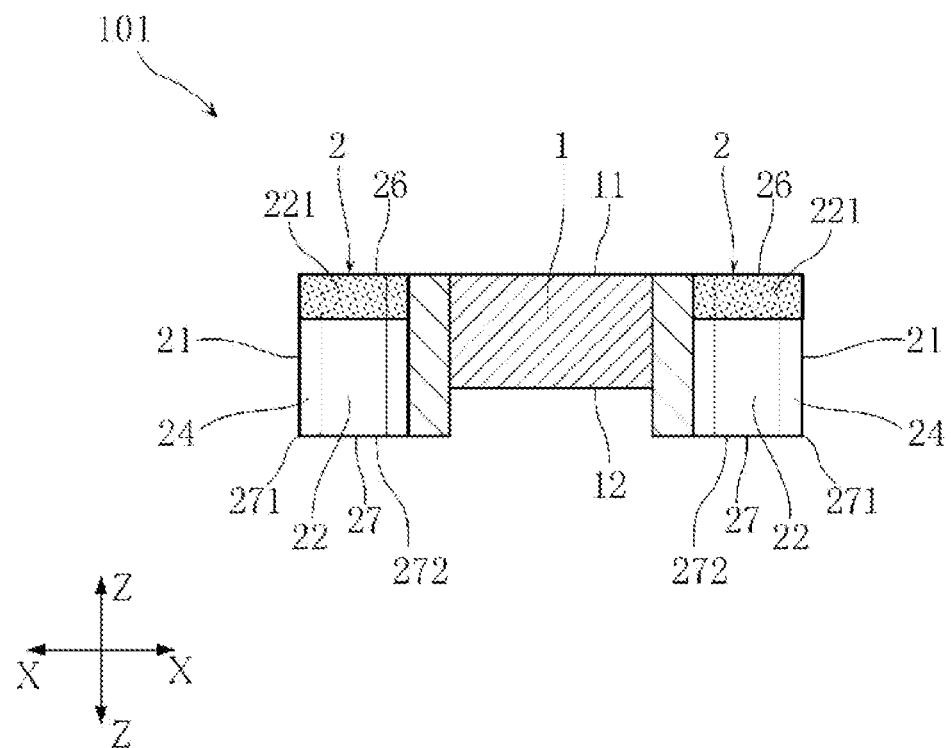
FIG. 5 is a cross-sectional view taken along line V-V in FIG. 2.
Figure 7:
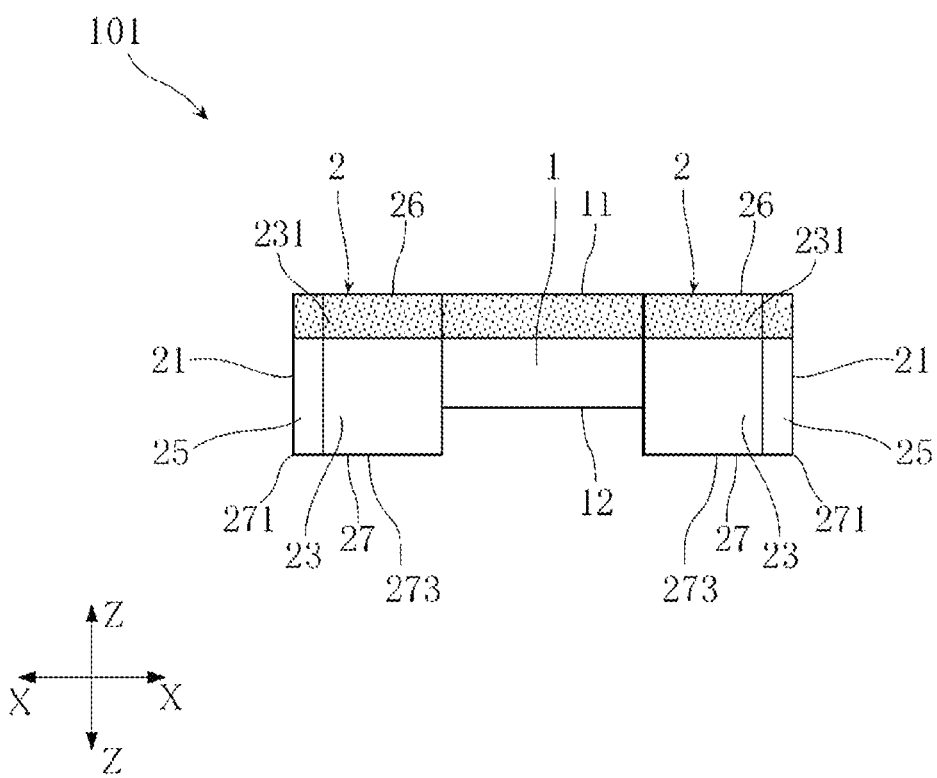
FIG. 7 is a view viewed from arrow VII-VII in FIG. 2.

As illustrated in FIG. 5, like the side surface 21, the side surface 22 has a fracture pattern surface 221. As illustrated in FIG. 7, like the side surface 21, the side surface 23 has a fracture pattern surface 231. Since the fracture pattern surface 221 of the side surface 22 and the fracture pattern surface 231 of the side surface 23 are the same as the fracture pattern surface 211 of the side surface 21, a description thereof will be omitted.

The pair of sub-electrodes 3 is formed of a conductive material, for example, Cu, Ni, or Fe. The pair of sub-electrodes 3 is separated from each other in the X direction with the resistance body 1 interposed therebetween. The sub-electrodes 3 are separated from the main electrodes 2 in the Y direction. The main electrodes 2 and the sub-electrodes 3 that are separated from each other in the Y direction are adjacent to each other with the concave portions 4 recessed in the X direction interposed therebetween. Therefore, the concave portions 4 make a pair in the X direction. In the present embodiment, the positions of the concave portions 4 that make a pair coincide with each other in the Y direction. The resistance body 1 and the sub-electrodes 3 are bonded to each other, for example, by welding, as described later. The thicknesses of respective parts of the sub-electrode 3 are uniform. The thickness of the sub-electrode 3 is larger than that of the resistance body 1. In the present embodiment, the dimension of the sub-electrode 3 in the Y direction is smaller than the dimension of the main electrode 2 in the Y direction. In addition, in the present embodiment, the concave portion 4 is positioned outside a boundary between the resistance body 1 and the adjacent main electrode 2 and sub-electrode 3 in the X direction, when viewed from the Z direction. Therefore, the adjacent main electrode 2 and sub-electrode 3 are connected to the concave portion 4.

Each of the pair of sub-electrodes 3 has side surfaces 31, 32, and 33, curved surfaces 34 and 35, a top surface 36, and a bottom surface 37. The side surface 31 faces toward the X direction. The side surface 32 faces the adjacent main electrode 2 with the concave portion 4 interposed therebetween. The side surface 33 is positioned in the opposite direction to the adjacent main electrode 2. In the present embodiment, the side surfaces 32 and 33 face toward the Y direction. The top surface 36 and the bottom surface 37 face toward Z direction. In the present embodiment, the top surface 36 of the sub-electrode 3 is flush with the top surface 11 of the resistance body 1, and the bottom surface 37 of the sub-electrode 3 protrudes more than the bottom surface 12 of the resistance body 1. The bottom surface 37 of the sub-electrode 3 is a surface on which an object is to be mounted. The bottom surface 37 includes a side edge 371, a side edge 372, and a side edge 373. The side surface 31 is extended from the side edge 371 to a corresponding side edge of the top surface 36 along the Z direction. The side surface 32 is extended from the side edge 372 to a corresponding side edge of the top surface 36 along the Z direction. The side surface 33 is extended from the side edge 373 to a corresponding side edge of the top surface 36 along the Z direction.

The curved surface 34 is interposed between the side surfaces 31 and 32. The curved surface 35 is interposed between the side surfaces 31 and 33. These curved surfaces 34 and 35 are formed to correspond to a shape of a punching mold which is used when a resistor assembly is divided into the chip resistors 101 by punching, as described later. In practice, the curved surfaces 34 and 35 may have a smaller radius of curvature than that illustrated in the drawings.

As illustrated in FIG. 3, the side surface 31 has a fracture pattern surface 311 where the fracture patterns are formed. The fracture patterns have concavo-convex shapes formed when a metal is fractured. In the present embodiment, the fracture pattern surface 311 is positioned near the top surface 36.

Figure 6:
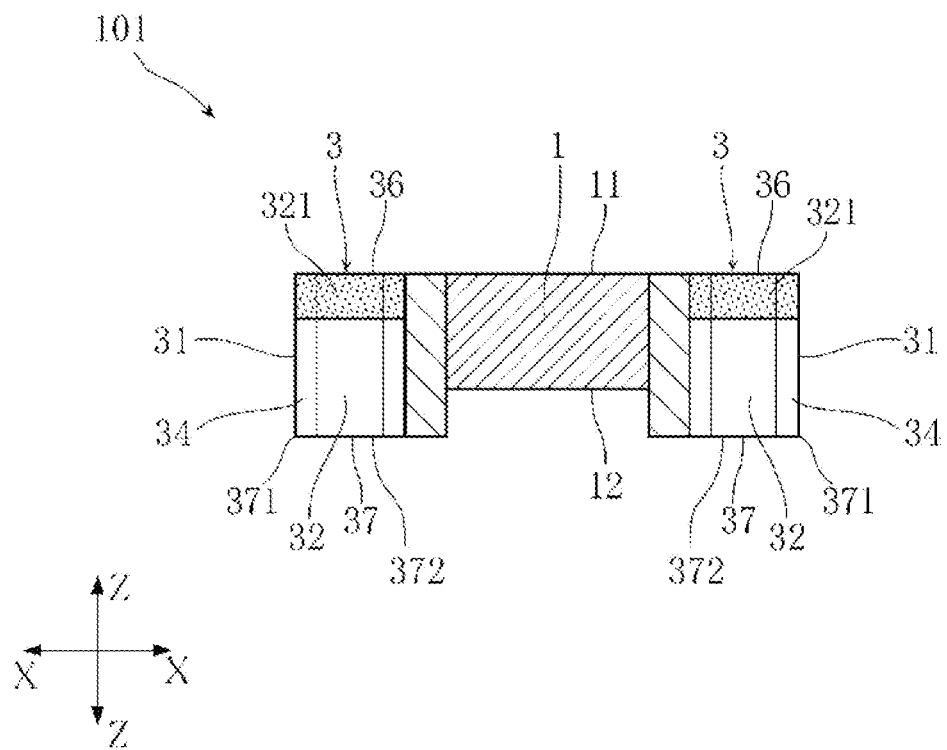
FIG. 6 is a cross-sectional view taken along line VI-VI in FIG. 2.
Figure 8:
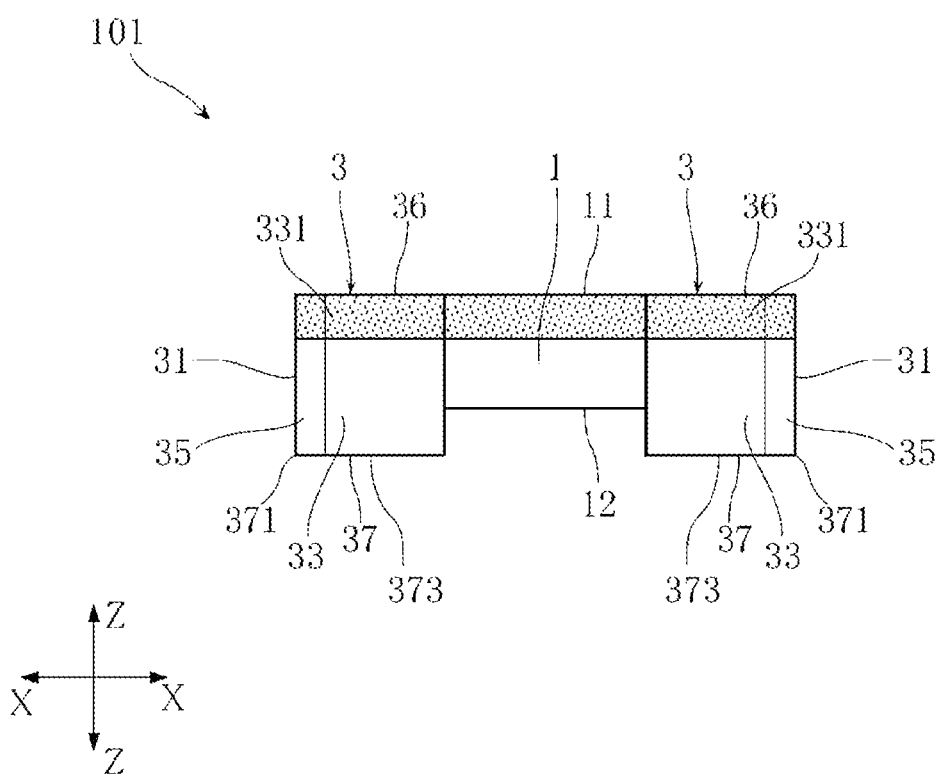
FIG. 8 is a view viewed from arrow VIII-VIII in FIG. 2.

As illustrated in FIG. 6, like the side surface 31, the side surface 32 has a fracture pattern surface 321. As illustrated in FIG. 8, like the side surface 31, the side surface 33 has a fracture pattern surface 331. Since the fracture pattern surface 321 of the side surface 32 and the fracture pattern surface 331 of the side surface 33 are the same as the fracture pattern surface 311 of the side surface 31, a description thereof will be omitted.

The dimensions of the respective parts described above are as follows. For example, the thickness of the resistance body 1 is about 0.1 to 5 mm, the thickness of the main electrode 2 and the thickness of the sub-electrode 3 are each about 0.1 to 10 mm, the dimension of the resistance body 1 in the X direction is about 1 to 50 mm, and the dimension of the resistance body 1 in the Y direction is about 1 to 50 mm. In addition, the chip resistor 101 has a resistance value of about 0.1 to 50 mΩ, for example.

Next, a method of manufacturing the chip resistor 101 will be described.

Figure 9:
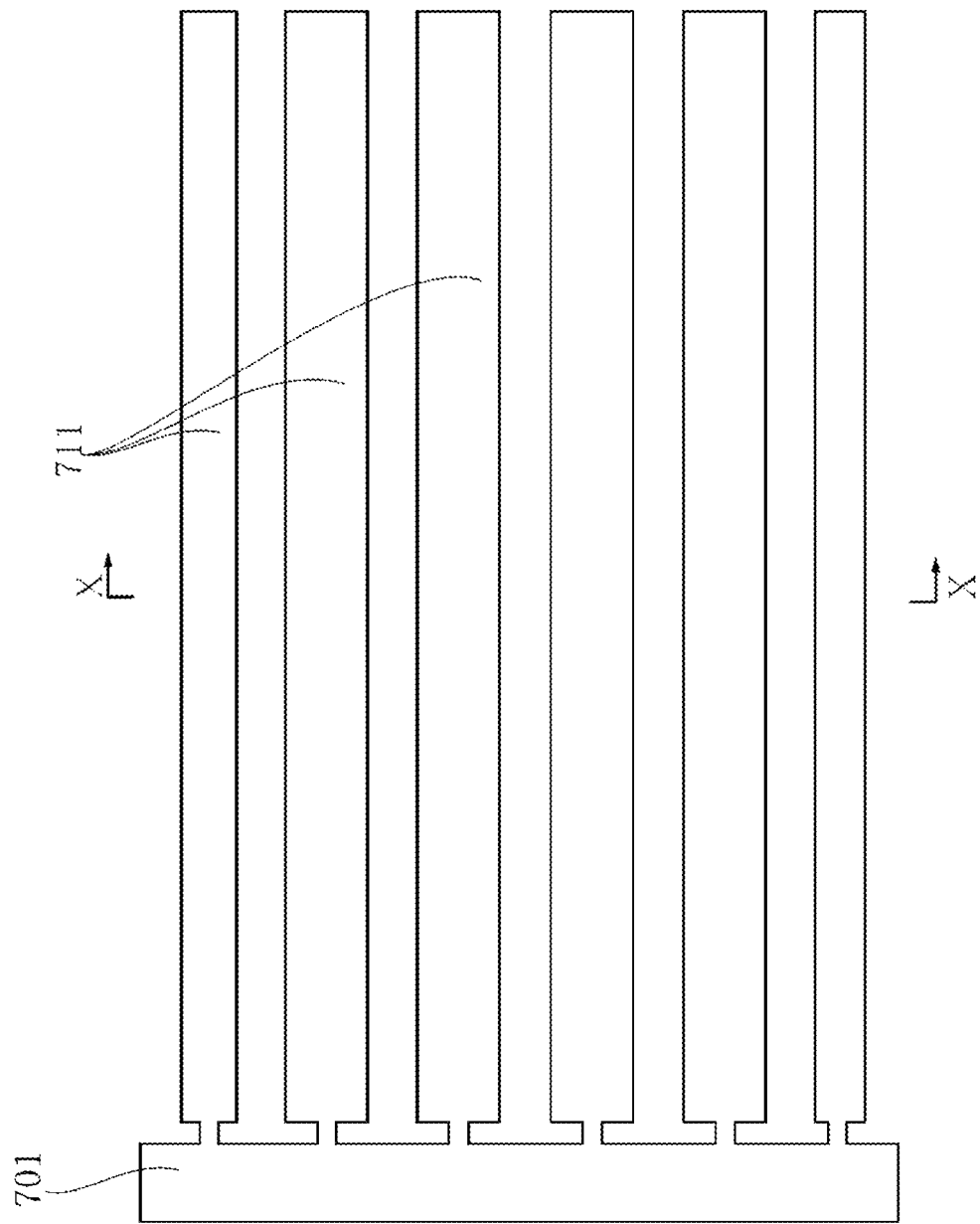
FIG. 9 is a plan view illustrating a process of a method of manufacturing the chip resistor according to the first embodiment of the present disclosure.
Figure 10:
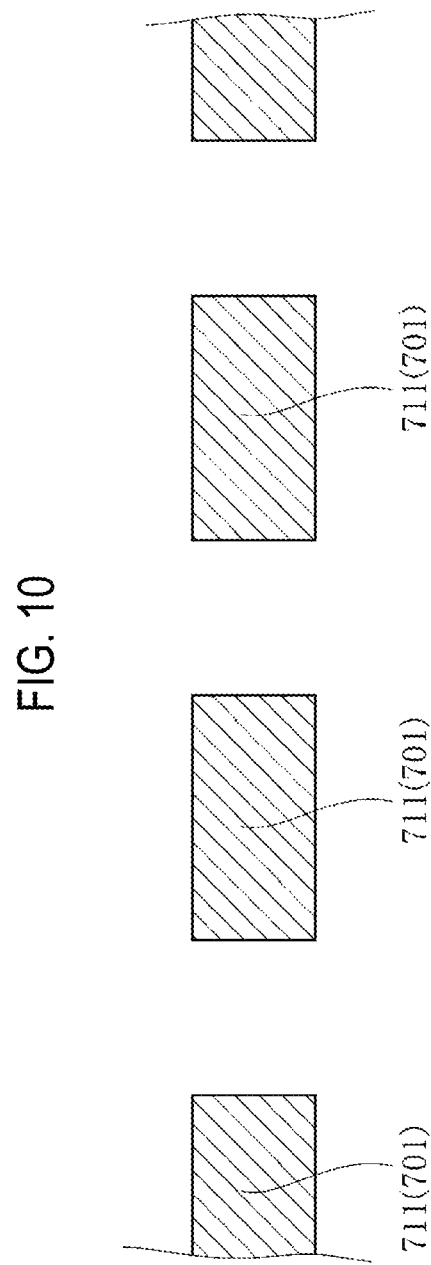
FIG. 10 is a cross-sectional view taken along line X-X in FIG. 9.

First, as illustrated in FIGS. 9 and 10, a conductive member 701 is prepared. In the present embodiment, the conductive member 701 is a leadframe that has a plurality of elongated conductive plates 711. In the present embodiment, the conductive member 701 has six elongated conductive plates 711. The plurality of elongated conductive plates 711 are extended in a longitudinal direction (i.e., the Y direction). In the conductive member 701, the plurality of elongated conductive plates 711 are arranged to be separated from each other in a width direction (i.e., a direction perpendicular to the longitudinal direction in which the elongated conductive plates 711 are extended). As illustrated in FIG. 10, the cross-section of each of the elongated conductive plates 711 has a rectangular shape. In the present embodiment, the conductive member 701 is formed so that the plurality of elongated conductive plates 711 are arranged to be separated from each other.

Figure 11:
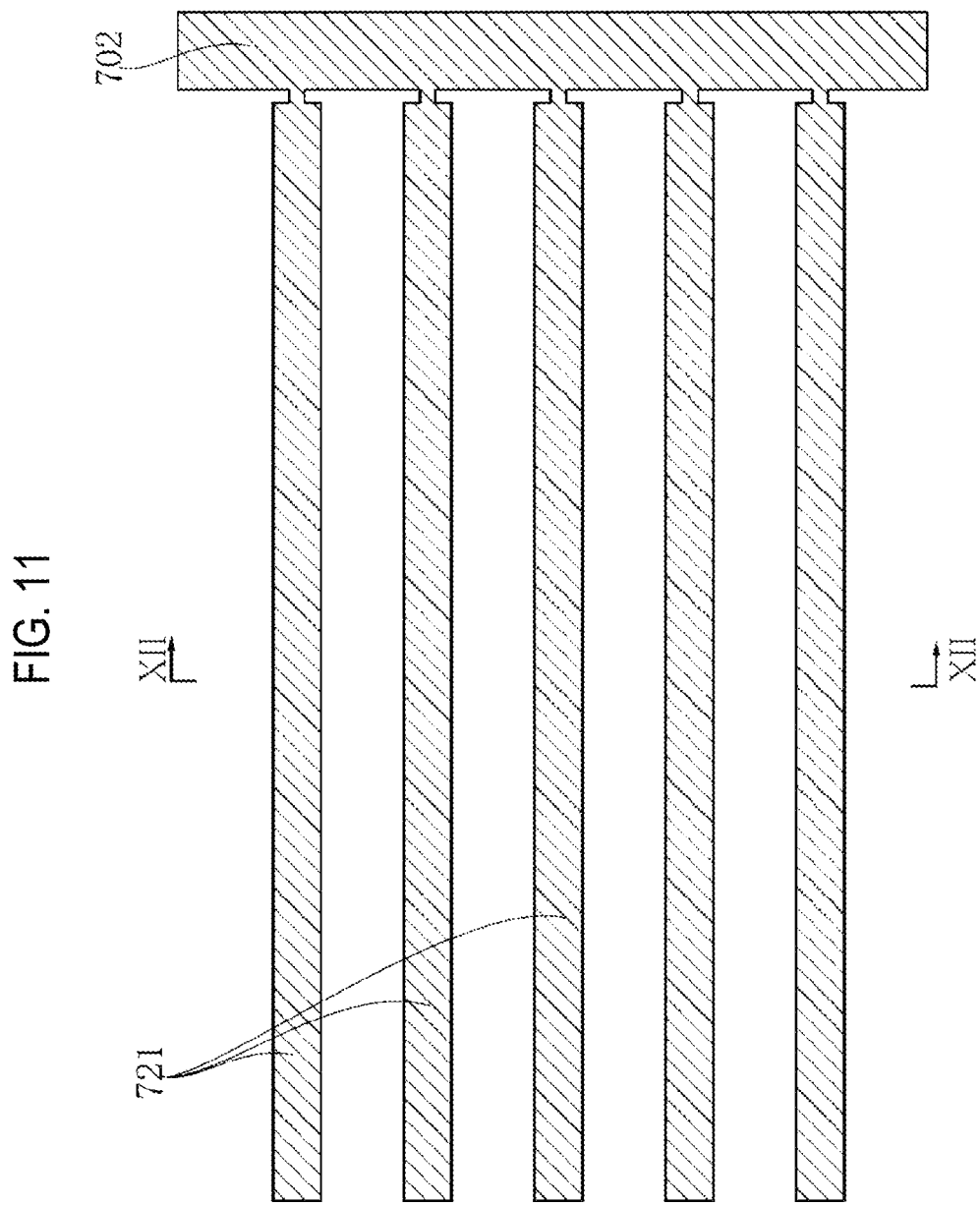
FIG. 11 is a plan view illustrating a process of the method of manufacturing the chip resistor according to the first embodiment of the present disclosure.
Figure 12:
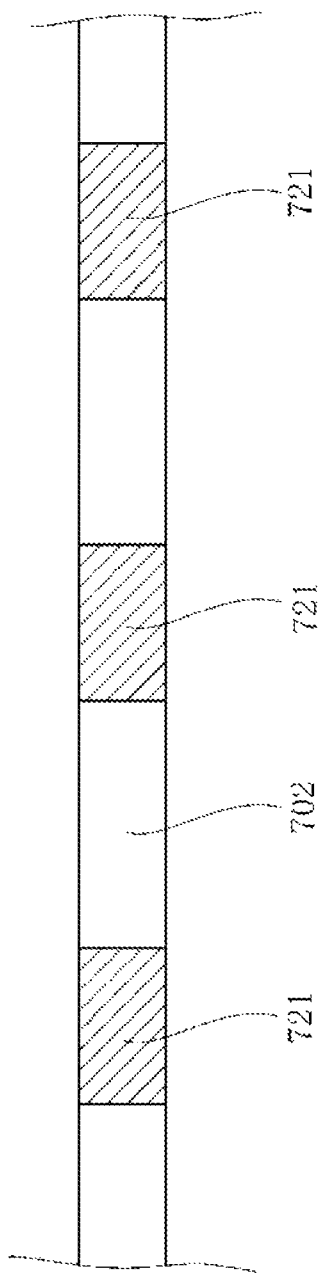
FIG. 12 is a cross-sectional view taken along line XII-XII in FIG. 11.

Similarly, as illustrated in FIGS. 11 and 12, a resistance body member 702 is prepared. In the present embodiment, the resistance body member 702 is a resistance body frame that has at least one elongated resistance body plate 721. In the present embodiment, the resistance body member 702 has five elongated resistance body plates 721. The plurality of elongated resistance body plates 721 are extended in a longitudinal direction (i.e., the Y direction). In the resistance body member 702, the plurality of elongated resistance body plates 721 are arranged to be separated from each other in a width direction (i.e., a direction perpendicular to the longitudinal direction in which the plurality of elongated resistance body plates 721 are extended). As illustrated in FIG. 12, the cross-section of each of the elongated resistance body plates 721 has a rectangular shape. The thickness of the respective elongated resistance body plates 721 is smaller than that of the elongated conductive plates 711. Meanwhile, in FIG. 11, for the convenience of understanding, the resistance body member 702 is hatched, which is the same as in the plan view after FIG. 11. Unlike in the present embodiment, the resistance body member 702 may be a flat plate having a size corresponding to that of the plurality of elongated conductive plates 711, when viewed from a plane (i.e., when viewed from the Z direction).

Figure 13:
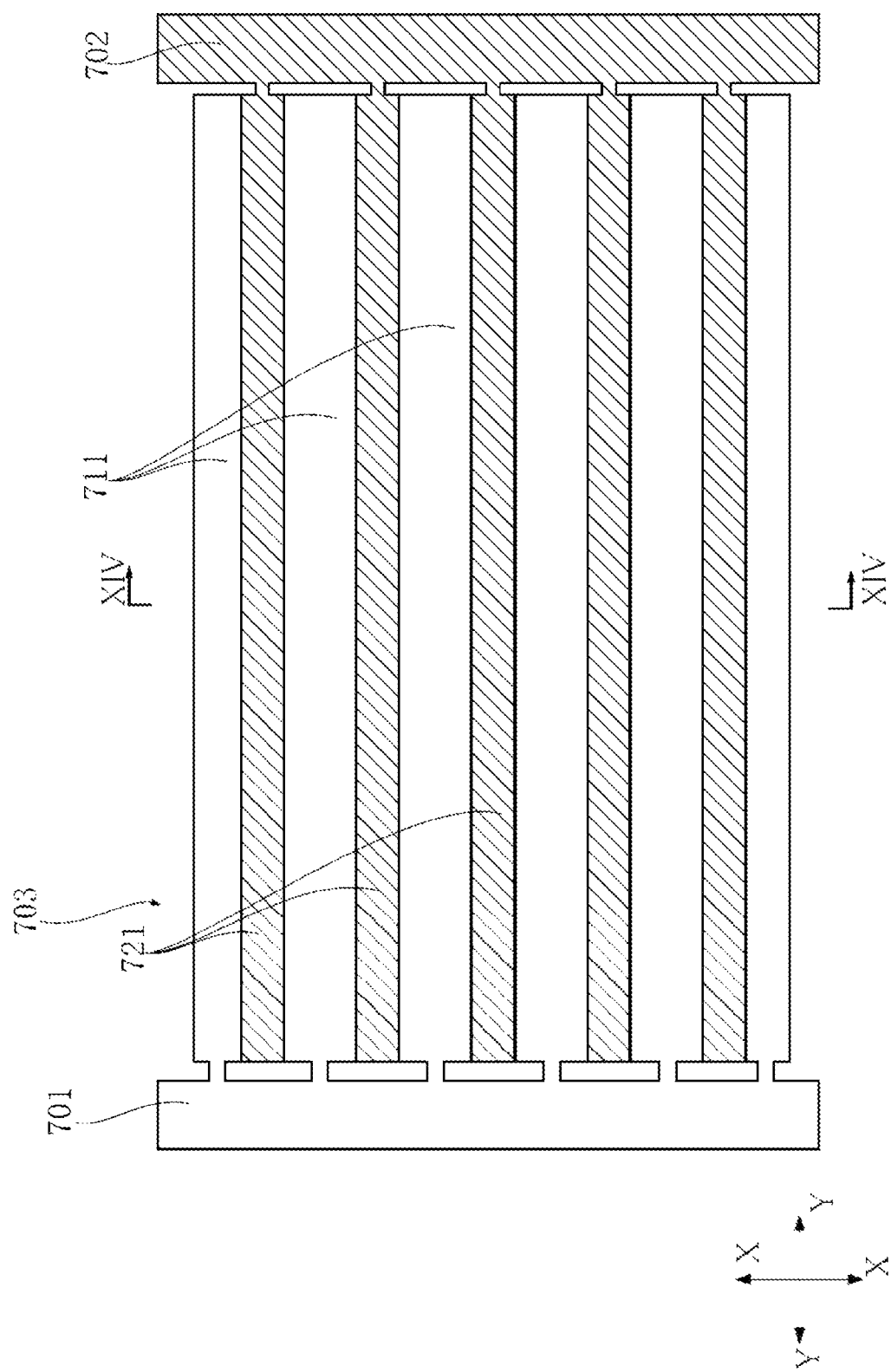
FIG. 13 is a plan view illustrating a process of the method of manufacturing the chip resistor according to the first embodiment of the present disclosure.
Figure 14:
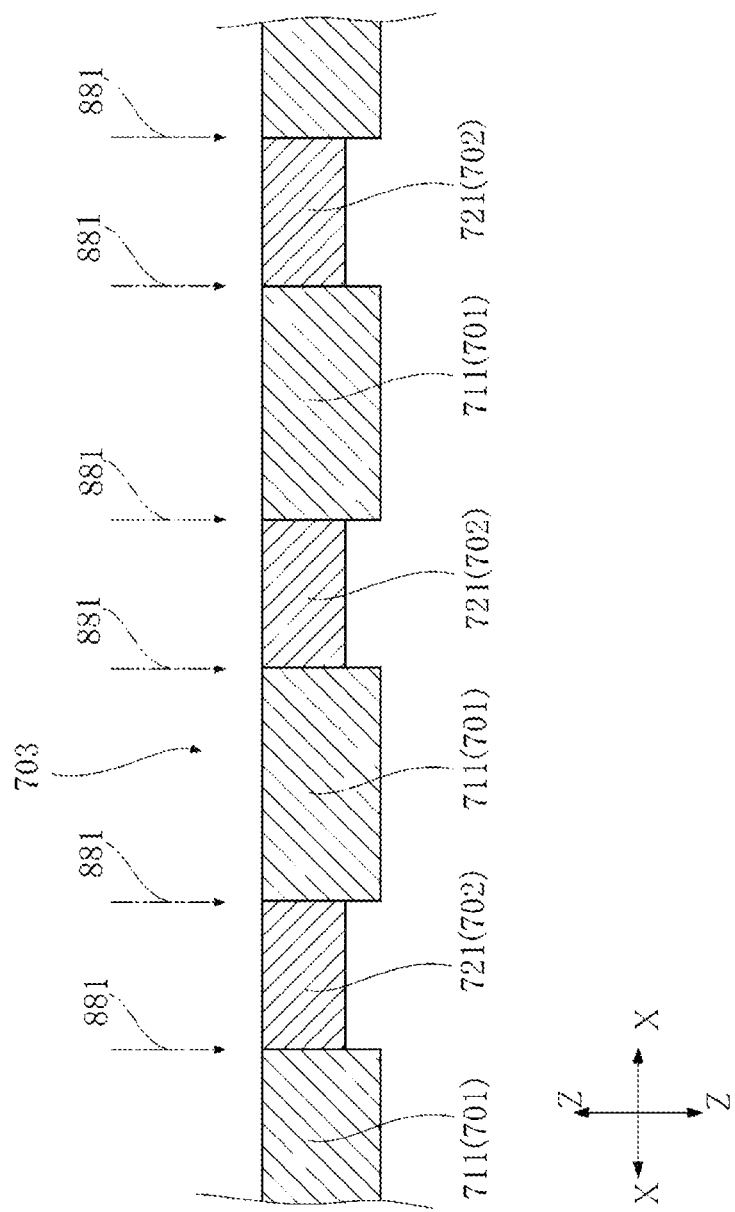
FIG. 14 is a cross-sectional view taken along line XIV-XIV in FIG. 13.

Next, as illustrated in FIGS. 13 and 14, a resistor assembly 703 is formed. In order to form the resistor assembly 703, the resistance body member 702 is bonded to the elongated conductive plates 711 of the conductive member 701. In the present embodiment, each of the plurality of elongated resistance body plates 721 is bonded to two adjacent elongated conductive plates among the plurality of elongated conductive plates 711. Thus, each of the plurality of elongated resistance body plates 721 is arranged in a position sandwiched between the two adjacent elongated plates among the plurality of elongated conductive plates 711.

The elongated conductive plates 711 and the resistance body member 702 may be bonded, for example, by welding.

Preferably, a high energy beam welding may be used as a welding method. The high energy beam welding may be an electron beam welding or a laser beam welding. When the high energy beam welding is performed, as illustrated in FIG. 14, a high energy beam 881 (an electron beam or a laser beam) is irradiated onto the elongated conductive plates 711 or the elongated resistance body plates 721, for example, in the Z direction. After the elongated conductive plates 711 or the elongated resistance body plates 721 are molten by the high energy beam 881, the elongated conductive plates 711 and the elongated resistance body plates 721 are bonded to each other. Alternatively, a soldering or brazing method in which silver paste or the like is used may be used for bonding the elongated conductive plates 711 and the resistance body member 702. Alternatively, an ultrasonic bonding method may be used for bonding the elongated conductive plates 711 and the resistance body member 702.

Figure 15:
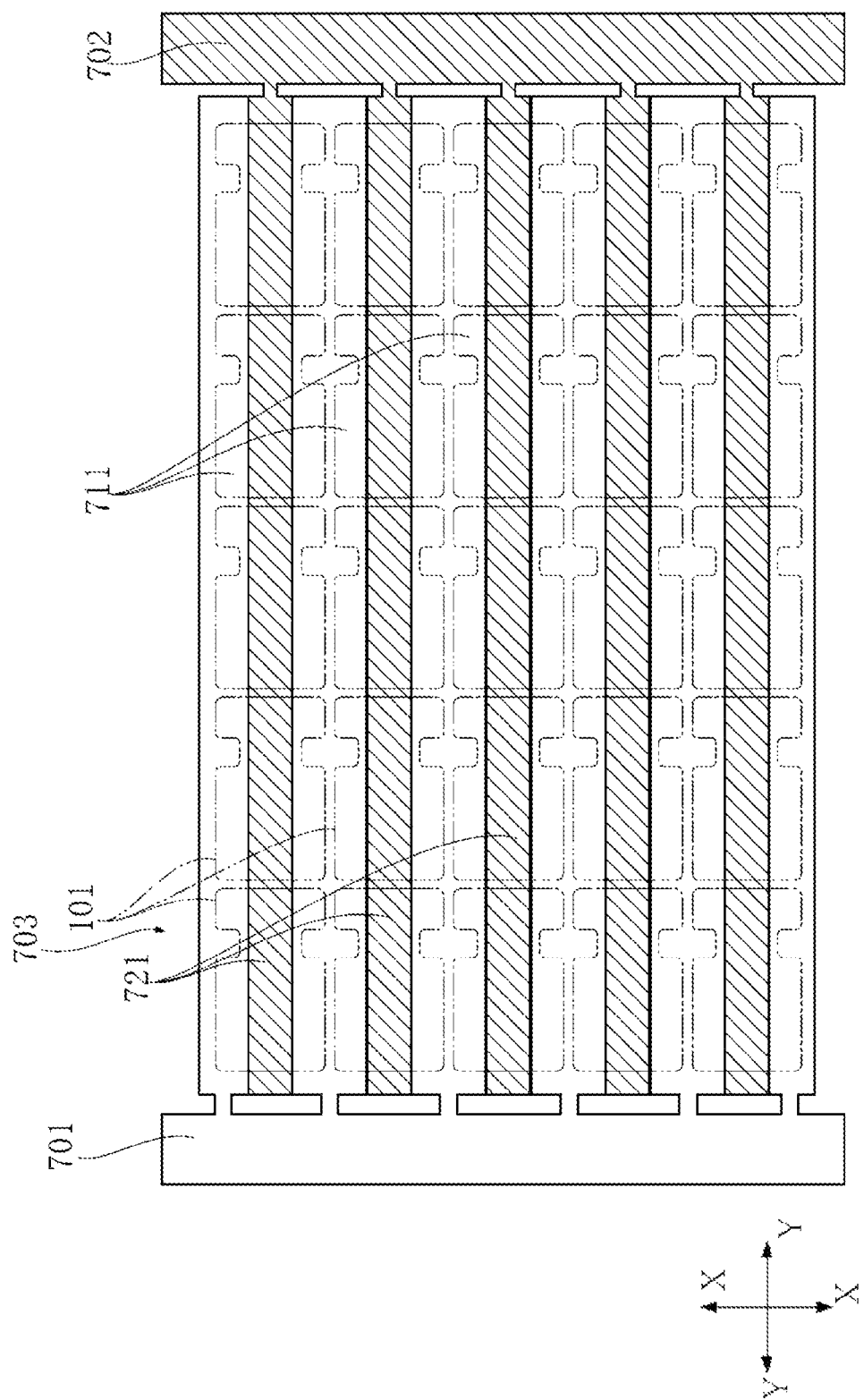
FIG. 15 is a plan view illustrating a process subsequent to the process illustrated in FIG. 13.

Next, as illustrated in FIG. 15, the resistor assembly 703 is collectively divided into a plurality of chip resistors 101 by punching. In FIG. 15, in the resistor assembly 703, regions that will become the chip resistors 101 are indicated by two point chain lines. For example, 25 chip resistors 101 may be obtained from one resistor assembly 703 as shown in FIG. 15. In order to divide the resistor assembly 703 into the plurality of chip resistors 101, a punching mold (not shown) having a shape corresponding to that of the chip resistors 101 that are indicated by two point chain lines in FIG. 15 is used. A recess having a shape corresponding to that of the concave portion 4 of the chip resistor 101 is formed in the punching mold. The resistor assembly 703 is punched by the punching mold in a direction entering a plane of FIG. 15. Here, corner portions of the punching mold may be properly rounded in order to improve durability when a punching process is repeatedly performed. The curved surfaces 24 and 25 of the main electrode 2 and the curved surfaces 34 and 35 of the sub-electrode 3 as described above are formed by punching the resistor assembly 703. These curved surfaces 24, 25, 34, and 35 are formed to correspond to the rounded corner portions of the punching mold. In addition, in the main electrode 2 and the sub-electrode 3, the side surfaces 21, 22, 23, 31, 32, and 33 having the fracture pattern surfaces 211, 221, 231, 311, 321, and 331, respectively, are formed by punching the resistor assembly 703. In this manner, the plurality of chip resistors 101 may be manufactured.

Next, the effect of the present embodiment will be described.

In the present embodiment, when the chip resistors 101 are manufactured, the resistor assembly 703 is divided into the chip resistors 101. Each of the chip resistors 101 includes the four electrodes (the pair of main electrodes 2 and the pair of sub-electrodes 3) by punching. The main electrodes 2 and the sub-electrodes 3 adjacent to each other in the Y direction with the concave portions 4 recessed in the X direction interposed therebetween are formed from the elongated conductive plates 711 (the conductive member 701) extended in the longitudinal direction (the Y direction) by punching. Since the chip resistors 101 are manufactured by punching as described above, the degree of precision in the dimension of the chip resistor 101, when viewed from a plane, is defined by the degree of precision in the dimension of the punching mold. In the method according to the present embodiment, when the resistor assembly 703 is punched, a punching mold that has a desired degree of precision for dimensions of respective parts may be used. A punching mold having recesses corresponding to the concave potions 4 of the chip resistor 101 is used so that it is possible to reduce errors in the dimensions of the main electrodes 2 and the sub-electrodes 3 in the directions X and Y. When it is possible to reduce the errors in the dimensions of the main electrodes 2 and the sub-electrodes 3 in the directions X and Y, it is possible to obtain the chip resistor 101 in which the resistance value of the resistance body 1 sandwiched between the pair of main electrodes 2 and the pair of sub-electrodes 3 is a desired value.

When the resistance value of the chip resistor 101 is the desired value, it is possible to omit a process of trimming the chip resistor 101, that is, of minutely controlling the resistance value of the chip resistor 101. Therefore, it is possible to reduce the number of chip resistors 101 to be trimmed. This is suitable for efficiently manufacturing the chip resistor 101.

In the present embodiment, a leadframe is used as the conductive member 701 and a resistance body frame is used as the resistance body member 702. Therefore, the plurality of elongated conductive plates 711 and the plurality of elongated resistance body plates 721 do not need to be separately maintained and thus can be easily handled.

The chip resistor 101 according to the present embodiment may be used, for example, for detecting current of an electric circuit. In order to detect the current of the electric circuit, for example, the pair of main electrodes 2 is used as current electrodes and the pair of sub-electrodes 3 is used as voltage electrodes. When the current of the electric circuit is detected, the pair of main electrodes 2 (the current electrodes) are electrically connected to the electric circuit so that the current of the electric circuit flows to the pair of main electrodes. A voltage meter is connected to the pair of sub-electrodes 3 (the voltage electrodes). Since a resistance value of the chip resistor 101 is already known, when voltage drop in the resistance body 1 of the chip resistor 101 is measured by using the voltage meter, it is possible to know a value of the current that flows to the resistance body 1 by applying the measured value to the Ohm's equation. In the chip resistor 101 of the present embodiment, as described above, the resistance value of the resistance body 1 sandwiched between each of the pair of main electrodes and each of the pair of sub-electrodes is the desired value. Therefore, it is possible to precisely detect the current of the electric circuit by using the chip resistor 101.

When the current of the electric circuit is detected by using the chip resistor 101, the chip resistor 101 is mounted on a circuit board. The chip resistor 101 is put on the circuit board so that the four electrodes (the pair of main electrodes 2 and the pair of sub-electrodes 3) are positioned on four conductive terminals formed on the circuit board and is soldered to be mounted on the circuit board. The terminals of the circuit board have a shape corresponding to that of the electrodes. In the present embodiment, the dimension of main electrodes 2 in the Y direction is larger than that of the sub-electrodes 3 in the Y direction. When the dimension of the main electrodes 2 in the Y direction is increased, current may easily flow between the main electrodes 2 and the terminals and between the main electrodes 2 and the resistance body 1 in comparison with the case in which the dimension of the main electrodes 2 in the Y direction is equal to that of the sub-electrodes 3 in the Y direction. Therefore, it is possible to suppress a heating when current is detected by using the chip resistor 101.

In the present embodiment, the main electrode 2 and the sub-electrode 3 adjacent in the Y direction are separated from each other with the concave portion 4 recessed in the X direction interposed therebetween. Therefore, in the chip resistor 101, the positions of the four electrodes can precisely be identified, when viewed from a plane. When the four electrodes are put on the four terminals of the circuit board, it is possible to prevent the positions of the electrodes from being shifted and to properly mount the electrodes. In addition, according to the structure in which the main electrodes 2 and the sub-electrodes 3 are positioned with the concave portions 4 interposed therebetween, when the terminals are soldered, it is possible to prevent soldering from causing improper adhesion problems, such as covering the main electrodes 2 and the sub-electrodes 3. Furthermore, although the dimension of the main electrodes 2 in the Y direction is different from that of the sub-electrodes 3 in the Y direction, since the main electrodes 2 and the sub-electrodes 3 are positioned with the concave portion 4 interposed therebetween, it is possible to easily confirm a difference in the dimensions of the main electrodes 2 and the sub-electrodes 3, when viewed from a plane. This is preferable because the main electrodes 2 and the sub-electrodes 3 may be properly mounted on the terminals.

Figure 16:
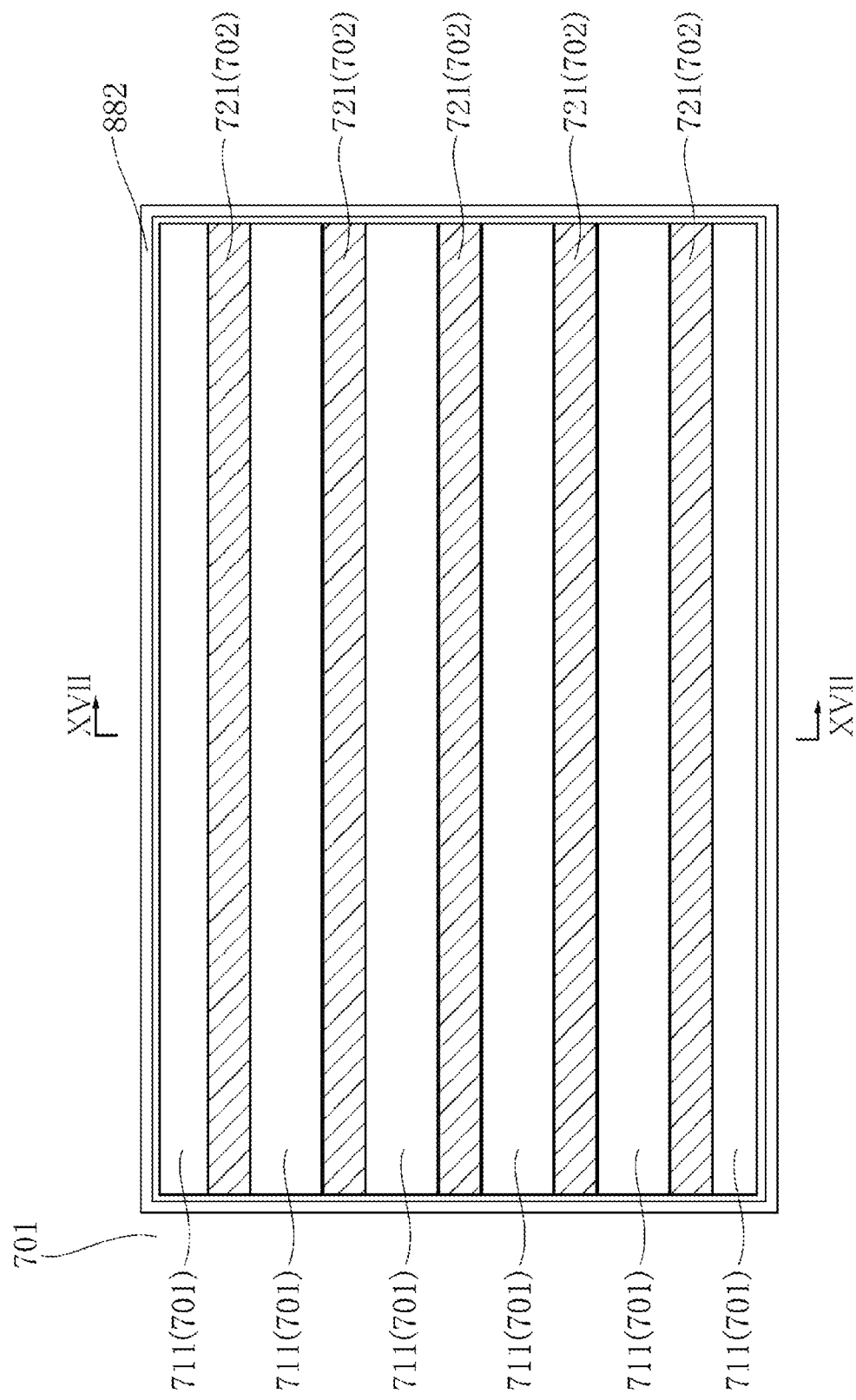
FIG. 16 is a plan view illustrating a process of a modification of the method of manufacturing the chip resistor according to the first embodiment of the present disclosure.
Figure 17:
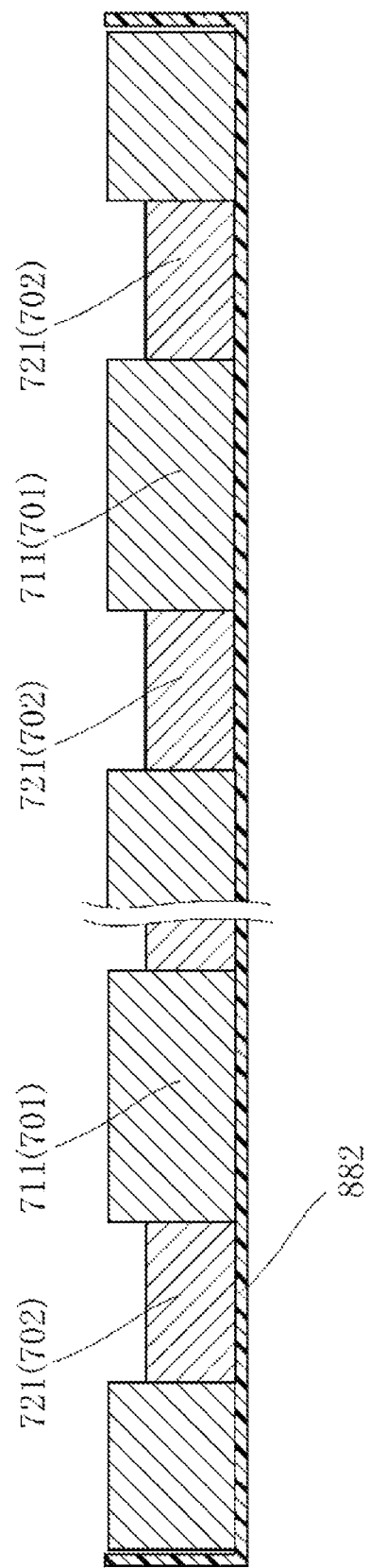
FIG. 17 is a cross-sectional view taken along line XVII-XVII in FIG. 16.

In the above-described method of manufacturing the chip resistor 101, the leadframe is used as the conductive member 701, but the leadframe may not be used. As illustrated in FIGS. 16 and 17, the plurality of separated elongated conductive plates 711 as the conductive member 701 may be arranged in a pallet 882. Similarly, the resistance body frame may not be used as the resistance body member 702. As illustrated in FIGS. 16 and 17, the elongated resistance body plates 721 may be arranged in gaps among the elongated conductive plates 711 arranged in the pallet 882. Also, after the elongated conductive plates 711 and the elongated resistance body plates 721 are arranged in the pallet 882, the elongated conductive plates 711 and the elongated resistance body plates 721 may be bonded to each other.

Figure 18:
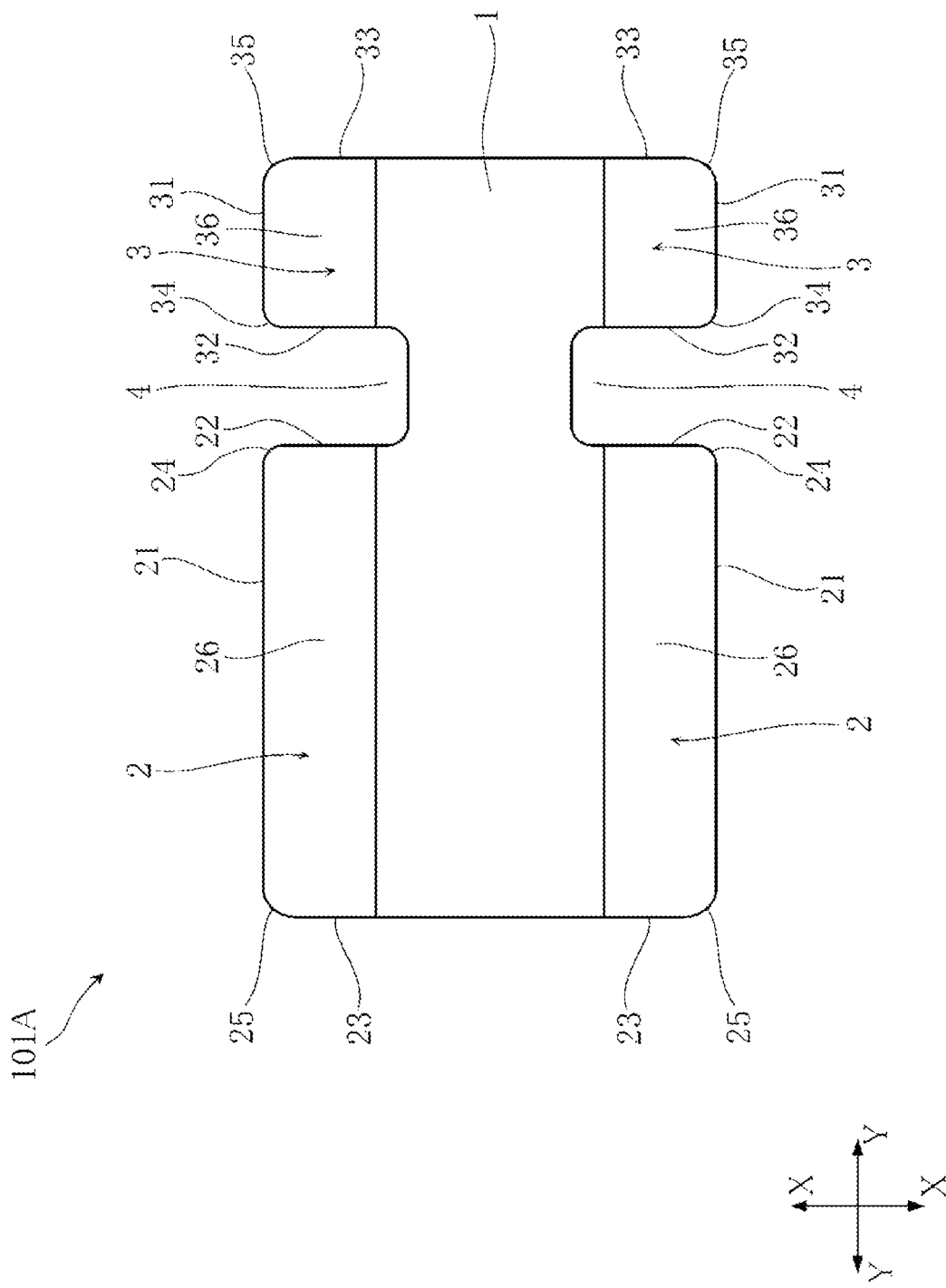
FIG. 18 is a plan view illustrating a modification of the chip resistor according to the first embodiment of the present disclosure.
Figure 19:
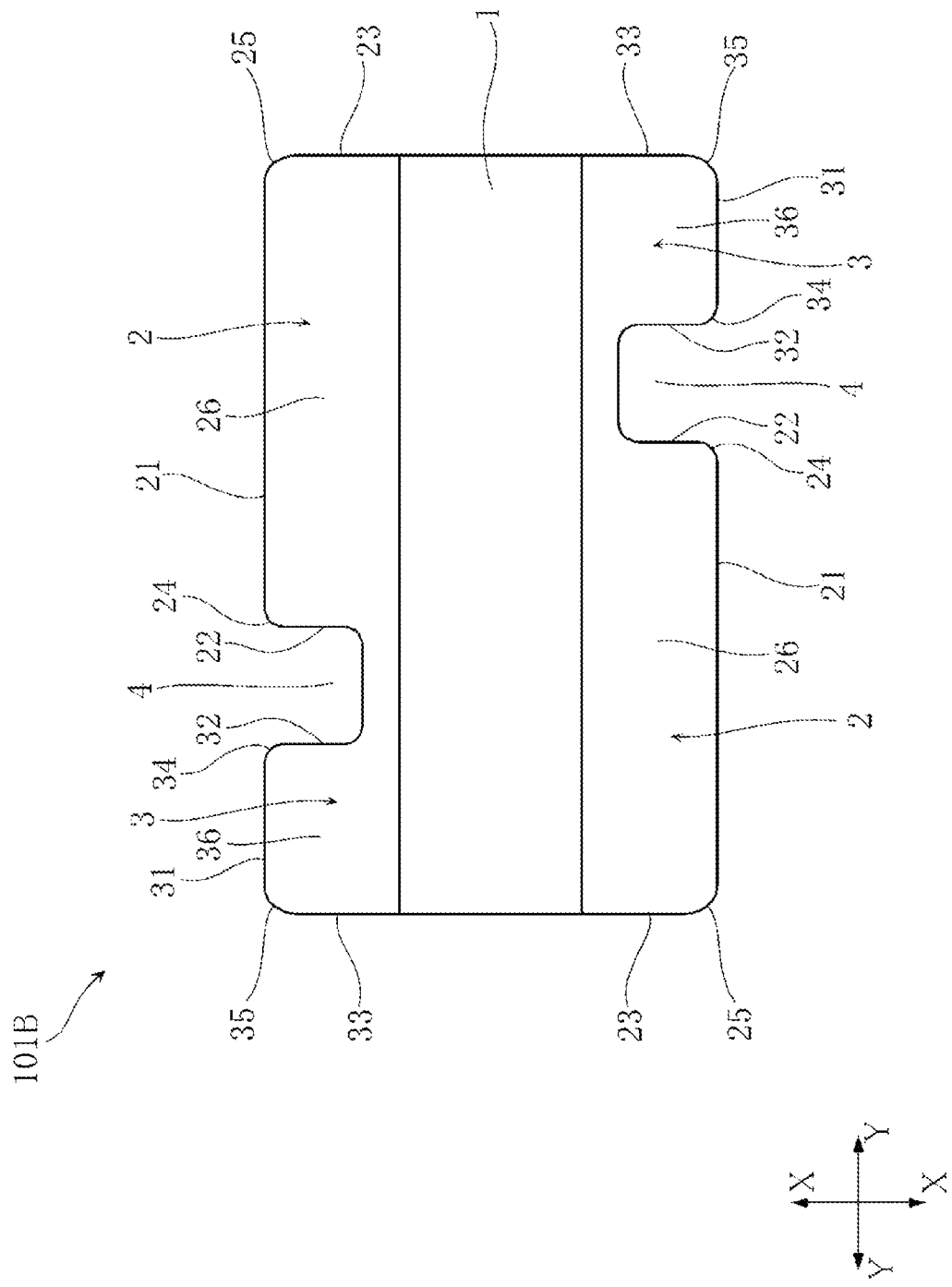
FIG. 19 is a plan view illustrating a modification of the chip resistor according to the first embodiment of the present disclosure.
Figure 20:
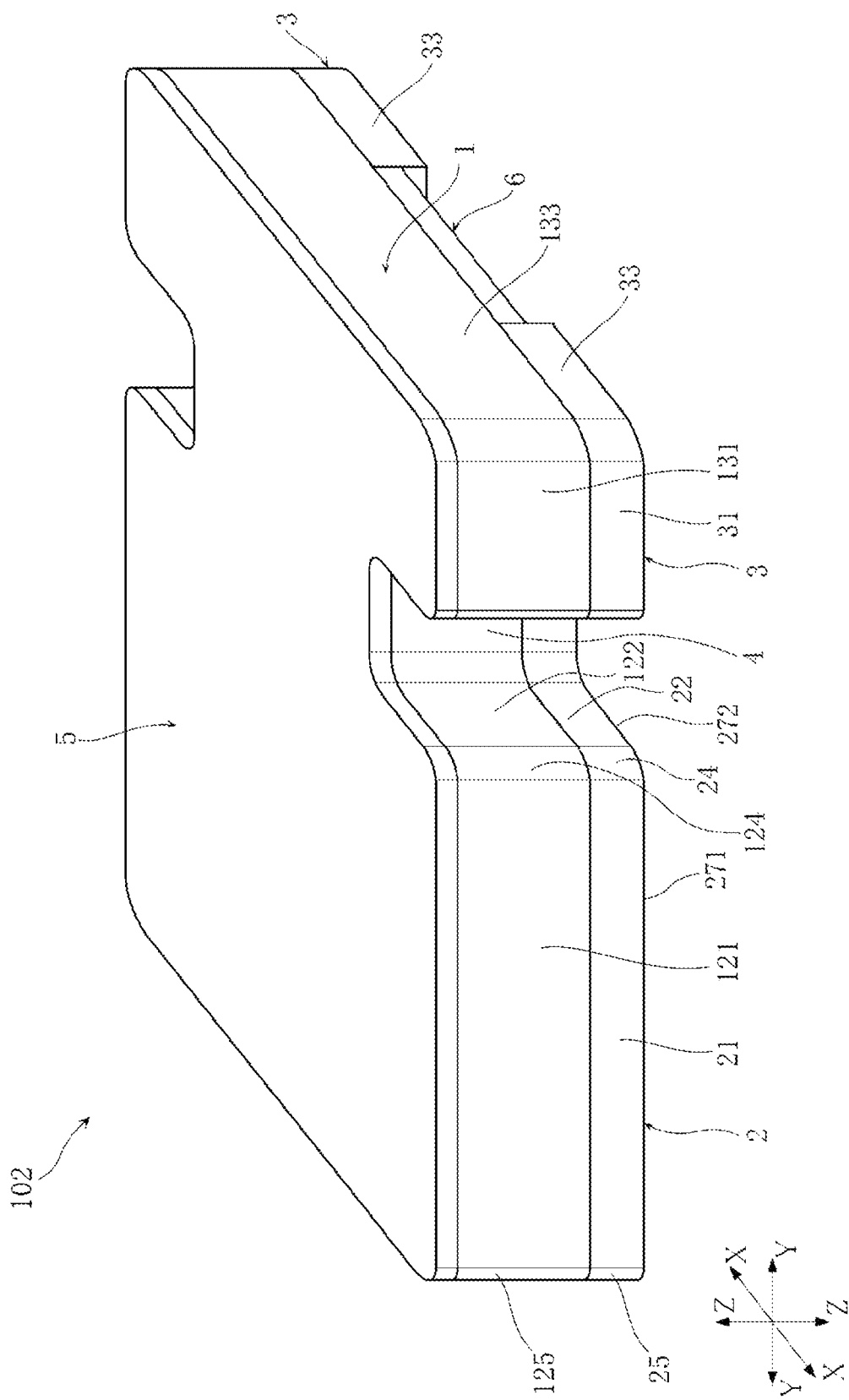
FIG. 20 is a perspective view of a chip resistor according to a second embodiment of the present disclosure.
Figure 21:
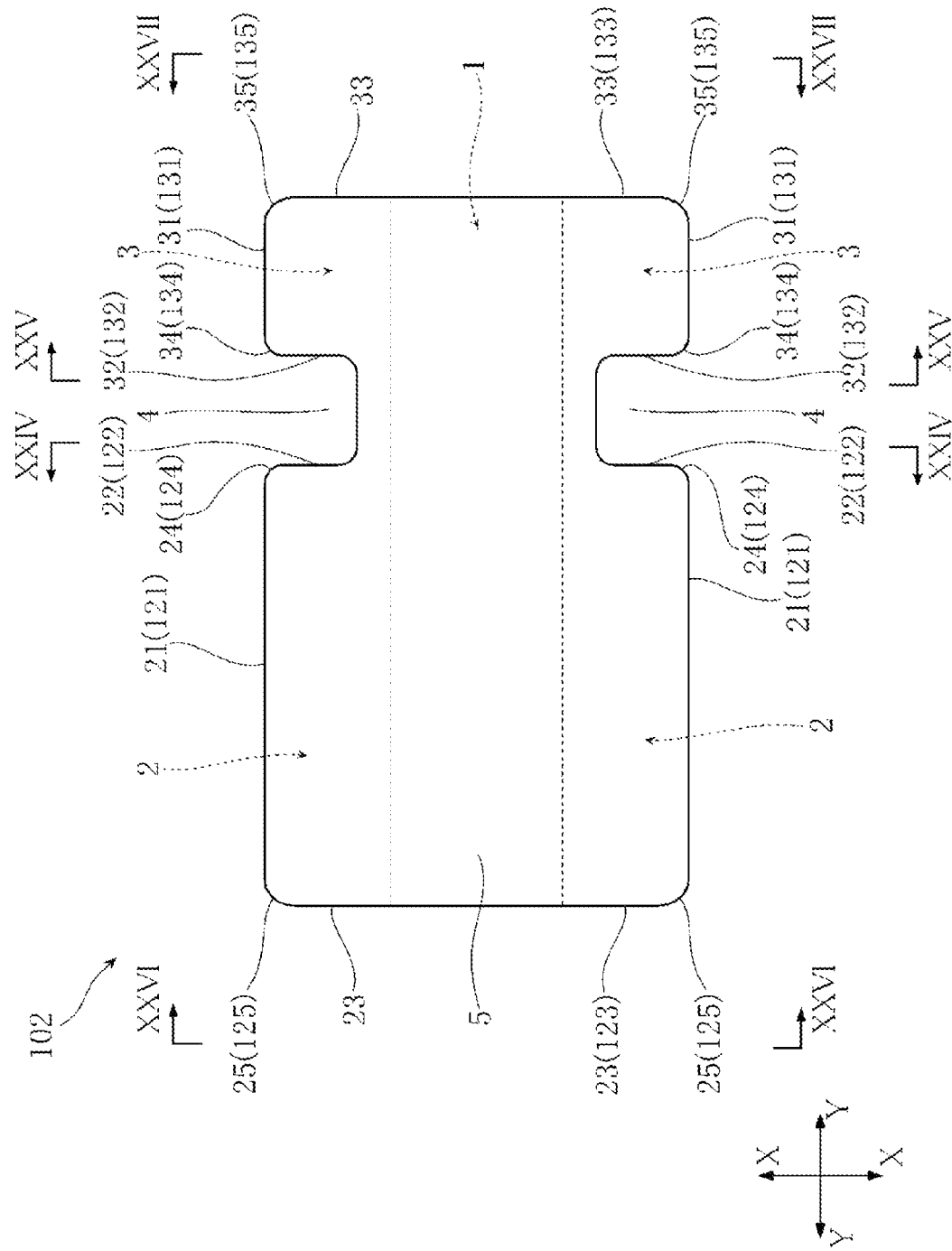
FIG. 21 is a plan view of the chip resistor illustrated in FIG. 20.

FIGS. 18 and 19 illustrate modifications of the foregoing chip resistor 101. In a chip resistor 101A illustrated in FIG. 18, a depth of the concave portion 4 in the X direction is larger than that of the chip resistor 101. When viewed from the Z direction, the concave portion 4 is more recessed than the boundary between the resistance body 1 and the adjacent main electrode 2 and sub-electrode 3 in the X direction. The chip resistor 101A may be obtained by punching the resistor assembly like the foregoing chip resistor 101. In this chip resistor 101A, the dimension of the concave portion 4 recessed to the inside of the resistance body 1, that is, the dimension of the partially removed resistance body 1 in the X direction is properly controlled so that the resistance value of the resistance body 1 may be controlled to a desired value. A dimensional error of the removed part of the resistance body 1 may be reduced by punching. Accordingly, in the chip resistor 101A of such a structure, the resistance value of the resistance body 1 may be correctly controlled to the desired value.

In a chip resistor 101B illustrated in FIG. 19, the positions of the pair of main electrodes 2 and the pair of sub-electrodes 3 are shifted in the Y direction so that the pair of main electrodes 2 and the pair of sub-electrodes 3 are arranged in the form of X. Therefore, the positions of the concave portions 4 are also shifted in the Y direction. In the chip resistor 101B of such a structure, the same effect as that of the chip resistor 101 may be obtained.

Hereinafter, other embodiments of the present disclosure are illustrated. Meanwhile, in the drawings that these embodiments refer to, the same reference numerals as those of the foregoing embodiment are denoted for the same or like elements as those of the foregoing embodiment Next, a second embodiment of the present disclosure will be described.

FIGS. 20 to 27 illustrate a chip resistor 102 according to a second embodiment of the present disclosure. The chip resistor 102 according to the second embodiment is mainly different from the chip resistor 101 in that it has the main electrodes 2 and the sub-electrodes 3 provided on the bottom surface 12 (the surface in the Z direction) of the resistance body 1 and that it includes insulating layers 5 and 6. The resistance body 1 has the same plane size as that of the chip resistor 102.

The resistance body 1 has side surfaces 121, 122, 123, 131, 132, and 133 and curved surfaces 124, 125, 134, and 135. The side surfaces 121 and 131 face toward the X direction. The side surfaces 122 and 132 face toward the Y direction and face each other. The side surfaces 123 and 133 face toward the Y direction and are positioned at opposite directions to each other. The side surfaces 121, 122, and 123 are connected to the side surfaces 21, 22, and 23 of the main electrode 2, respectively, and the curved surface 124 is interposed between the side surfaces 121 and 122. The curved surface 125 is interposed between the side surfaces 121 and 123. The curved surfaces 124 and 125 are connected to the curved surfaces 24 and 25 of the main electrode 2, respectively. These curved surfaces 124 and 125 are formed to correspond to a shape of a punching mold which is used when a resistor assembly is divided into the chip resistors 102 by punching, as described later. The side surfaces 131, 132, and 133 are connected to the side surfaces 31, 32, and 33 of the sub-electrode 3, respectively, and the curved surface 134 is interposed between the side surfaces 131 and 132. The curved surface 135 is interposed between the side surfaces 131 and 133. The curved surfaces 134 and 135 are connected to the curved surfaces 34 and 35 of the sub-electrode 3, respectively. These curved surfaces 134 and 135 are formed to correspond to the shape of the punching mold which is used when the resistor assembly is divided into the chip resistors 102 by punching, as described later.

Figure 22:
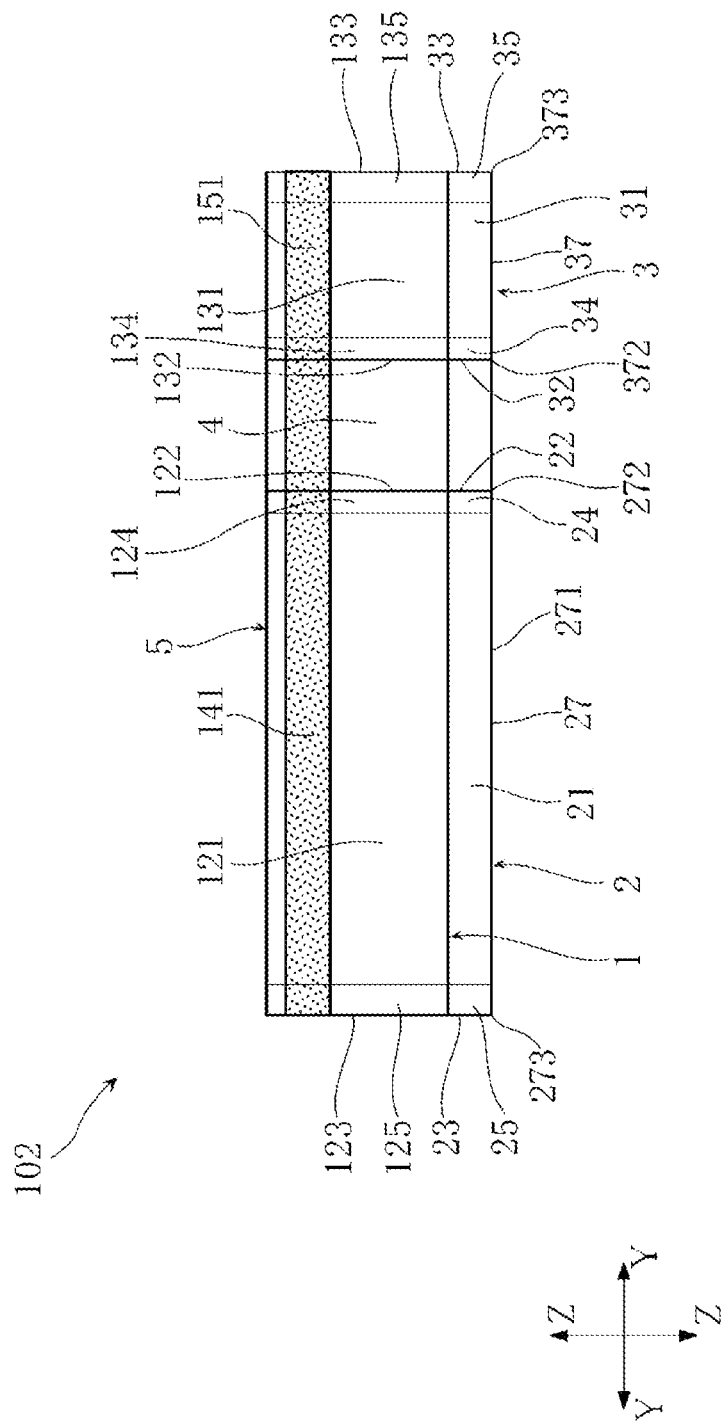
FIG. 22 is a front view of the chip resistor illustrated in FIG. 20.
Figure 23:
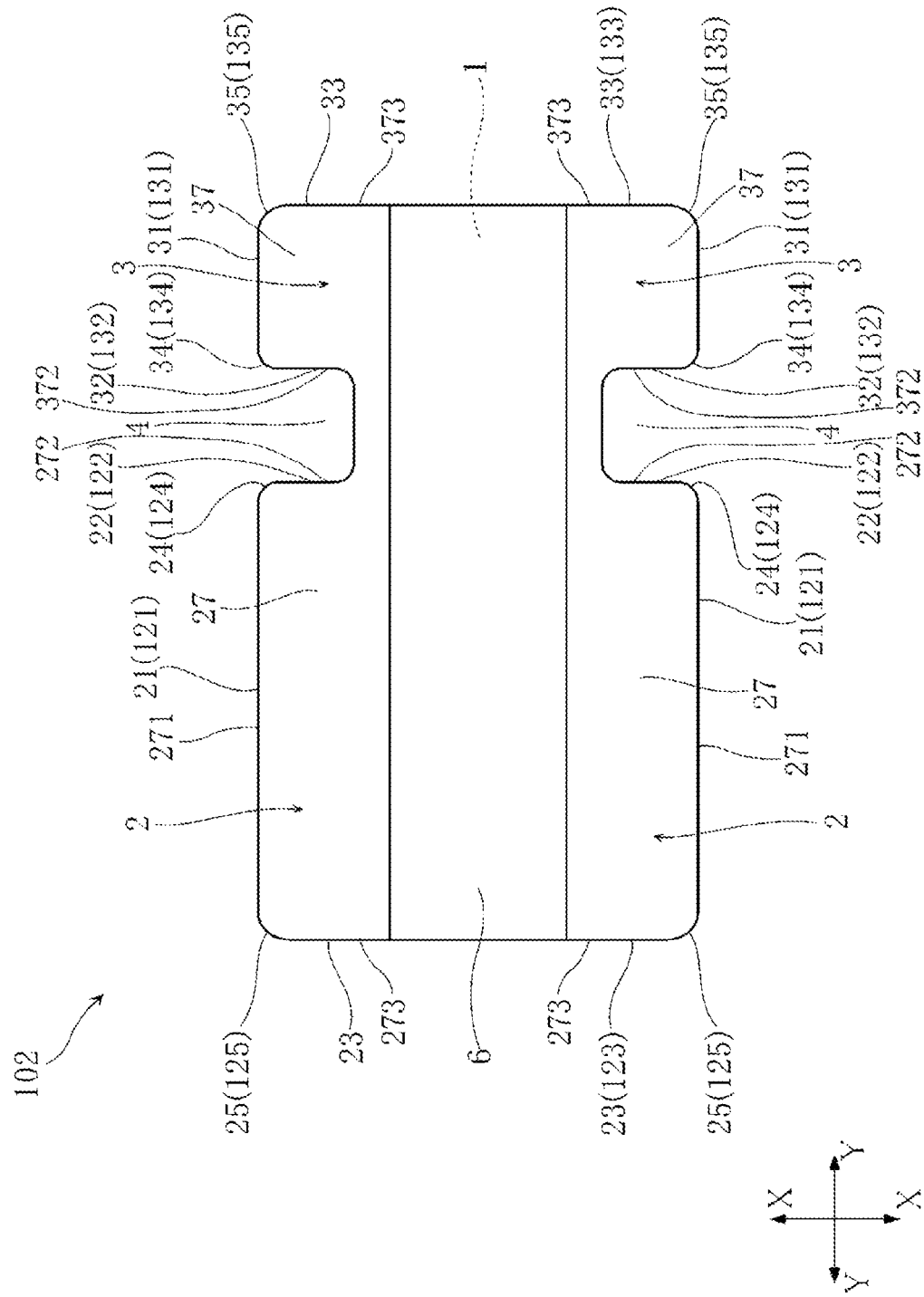
FIG. 23 is a bottom view of the chip resistor illustrated in FIG. 20.
Figure 24:
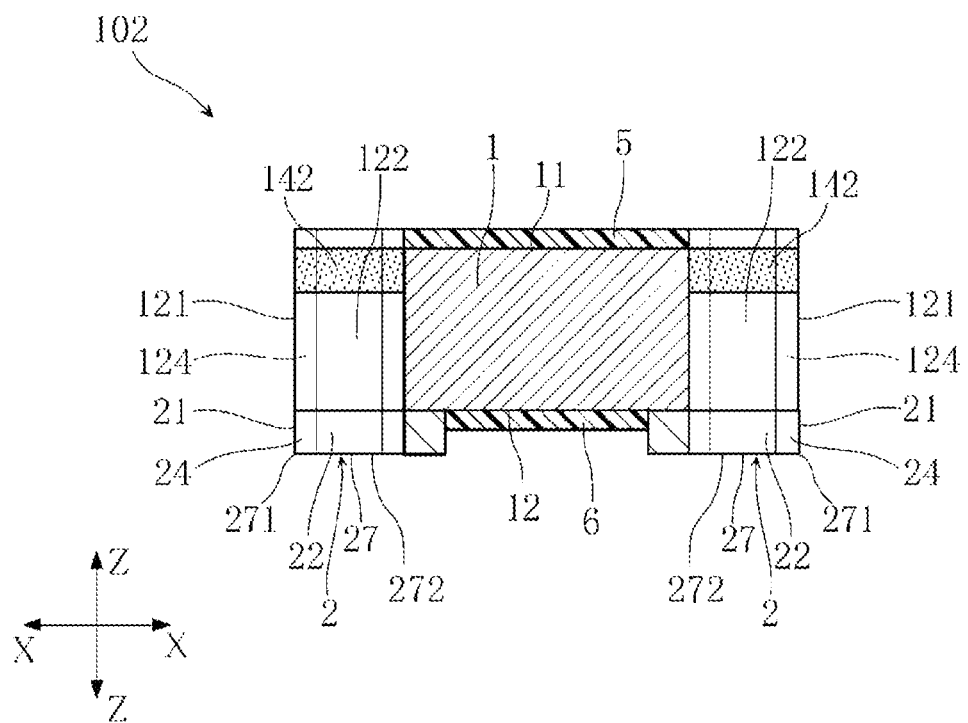
FIG. 24 is a cross-sectional view taken along line XXIV-XXIV in FIG. 21.
Figure 25:
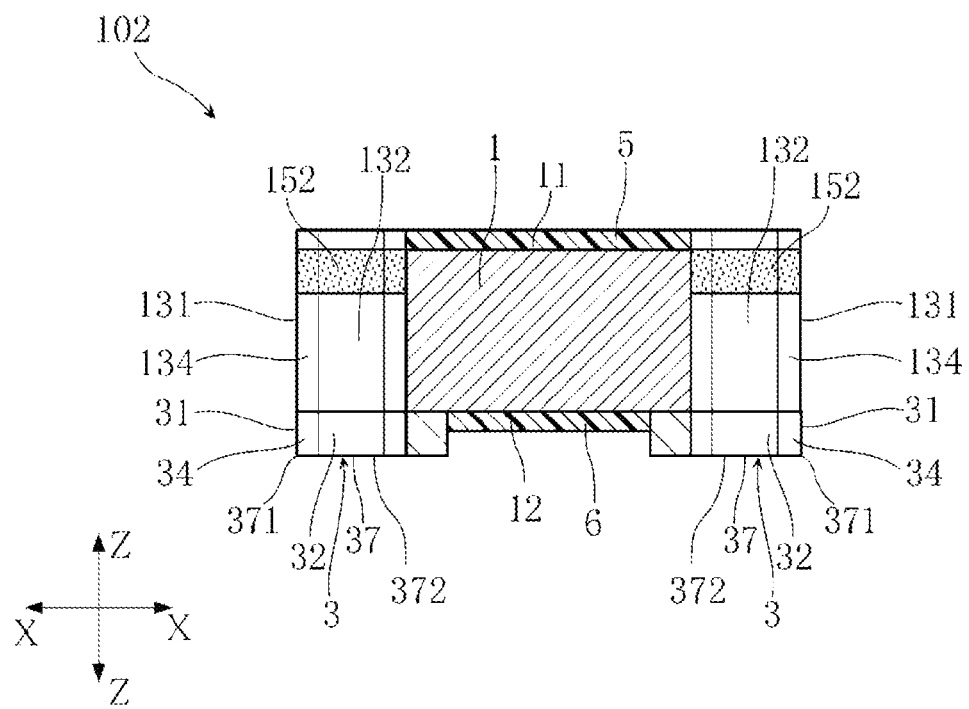
FIG. 25 is a cross-sectional view taken along line XXV-XXV in FIG. 21.
Figure 26:
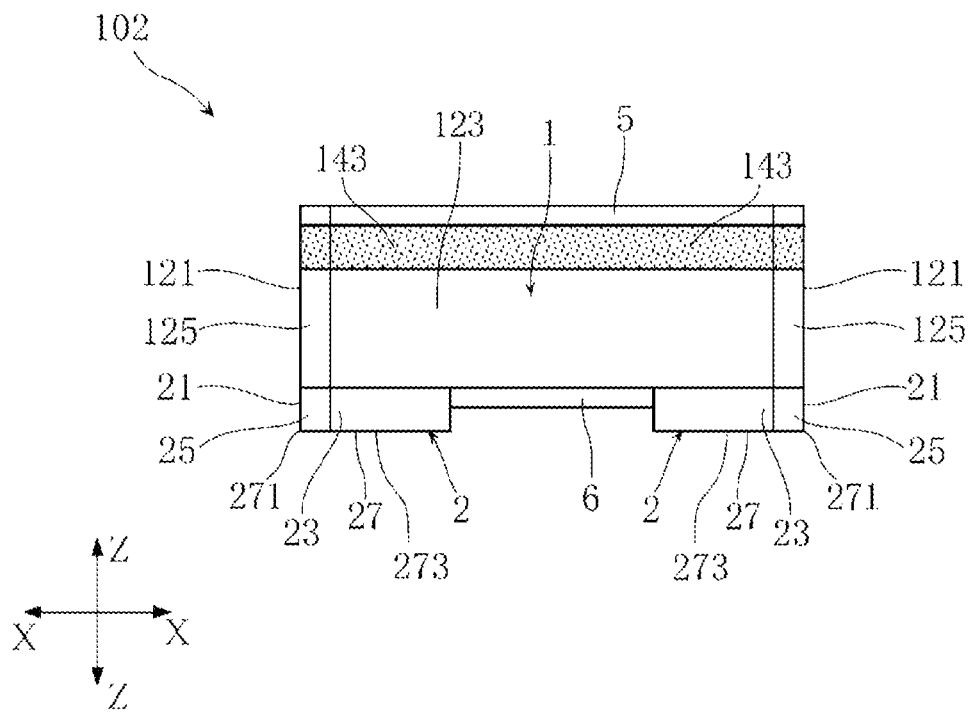
FIG. 26 is a view viewed from arrow XXVI-XXVI in FIG. 21.
Figure 27:
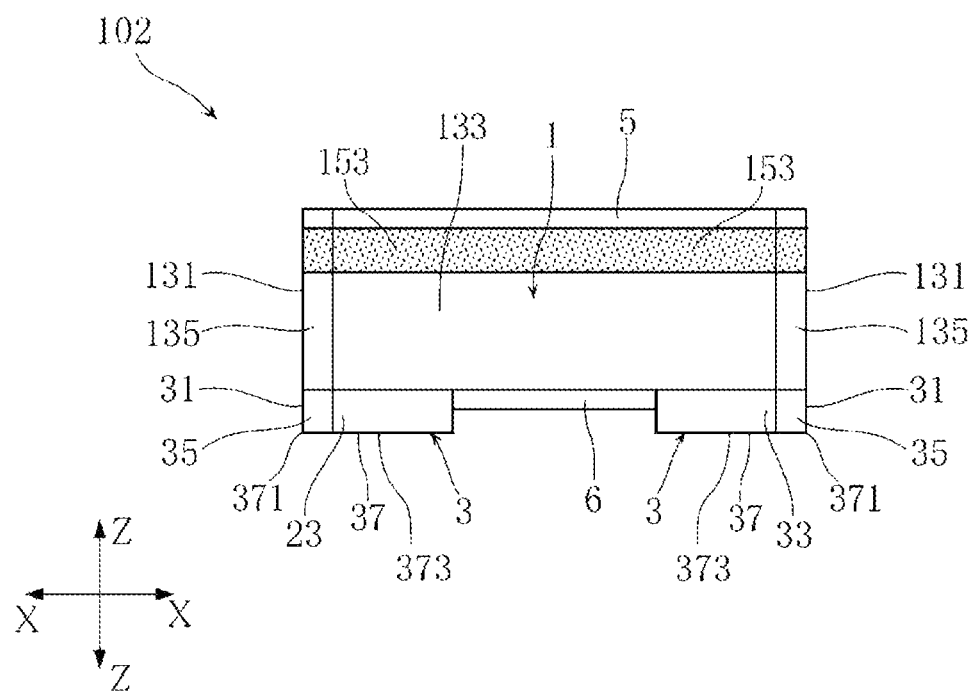
FIG. 27 is a view viewed from arrow XXVII-XXVII in FIG. 21.

As illustrated in FIG. 22, the side surfaces 121 and 131 have fracture pattern surfaces 141 and 151. As illustrated in FIG. 24, the side surface 122 has a fracture pattern surface 142. As illustrated in FIG. 26, the side surface 123 has a fracture pattern surface 143. As illustrated in FIG. 25, the side surface 132 has a fracture pattern surface 152. As illustrated in FIG. 27, the side surface 133 has a fracture pattern surface 153.

The insulating layer 5 is provided to cover an entire of the top surface 11 of the resistance body 1. The insulating layer 5 is formed by thick film printing and is, for example, an epoxy resin-based resin layer.

Figure 45:
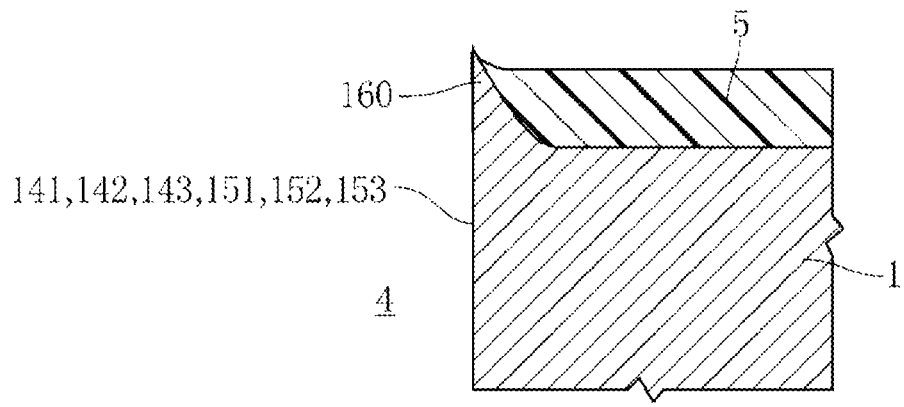
FIG. 45 is an enlarged cross-sectional view of a portion of the modification of the chip resistor illustrated in FIG. 20.

As illustrated in FIG. 45, an end edge stretch portion 160 is formed in each of the fracture pattern surfaces 141, 142, 143, 151, 152, and 153. The end edge stretch portion 160 is formed since an upper end of each of the fracture pattern surfaces 141, 142, 143, 151, 152, and 153 is stretched when the fracture pattern surfaces 141, 142, 143, 151, 152, and 153 are formed in a following manufacturing method. In the following manufacturing method, the end edge stretch portion 160 is formed to surround the insulating layer 5.

The insulating layer 6 is provided in a middle portion of the bottom surface 12 of the resistance body 1 in the X direction. The insulating layer 6 is provided in a region between the pair of main electrodes 2, and in a region between the pair of sub-electrodes 3. The insulating layer 6 is formed of the same material as that of the insulating layer 5 and is formed by thick film printing like the insulating layer 5.

Figure 44:
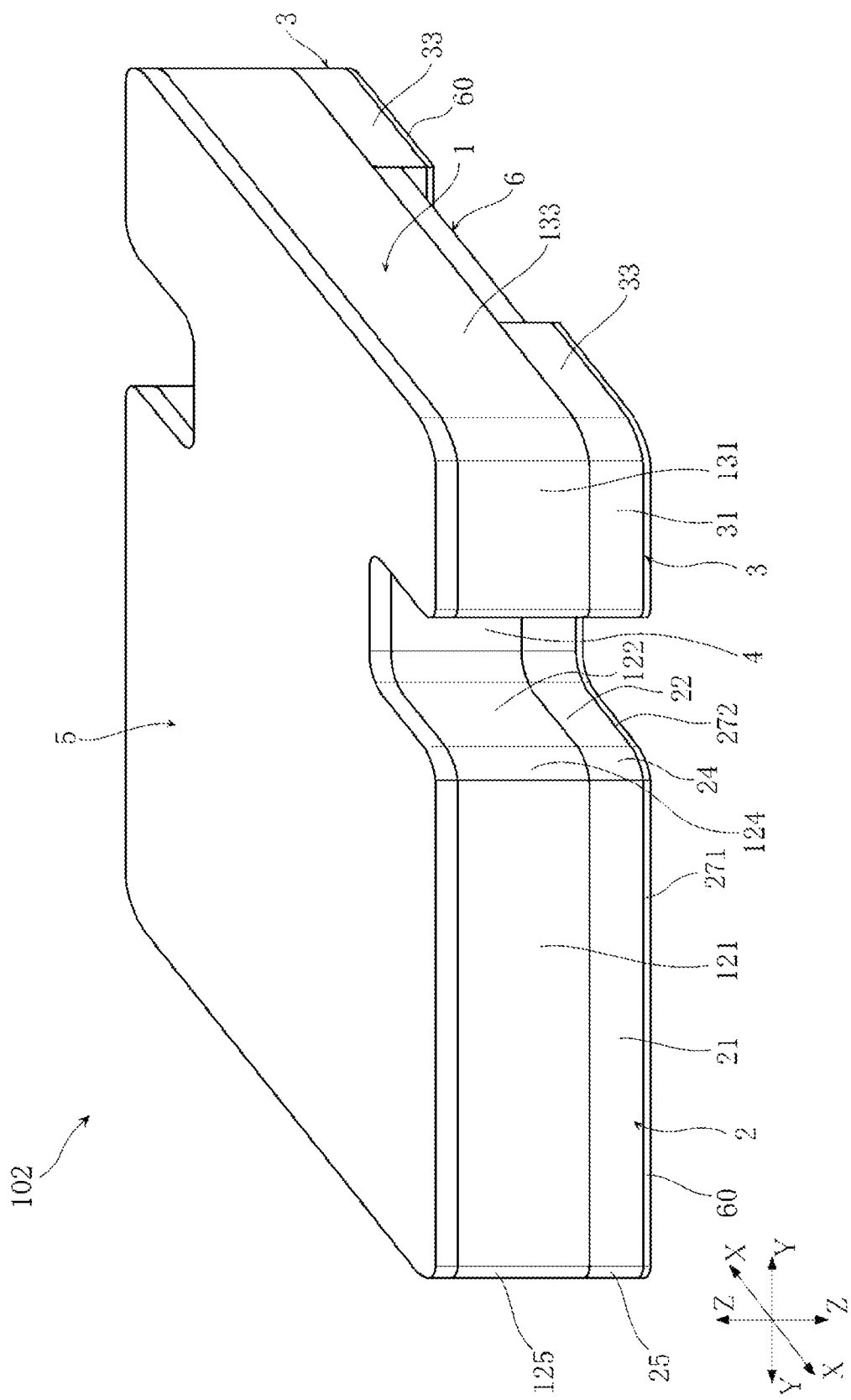
FIG. 44 is a perspective view illustrating a modification of the chip resistor illustrated in FIG. 20.

The pair of main electrodes 2 is separated from each other with the insulating layer 6 interposed therebetween in the X direction. The pair of main electrodes 2 is formed, for example, by performing Cu plating on the resistance body 1, as described later. The pair of sub-electrodes 3 is divided from each other with the insulating layer 6 interposed therebetween in the X direction. The pair of sub-electrodes 3 is formed, for example, by performing Cu plating on the resistance body 1, as described later. Meanwhile, as illustrated in FIG. 44, a solder layer 60 for improving solderability may be laminated under the main electrodes 2 and the sub-electrodes 3.

Next, a method of manufacturing the chip resistor 102 will be described.

Figure 28:
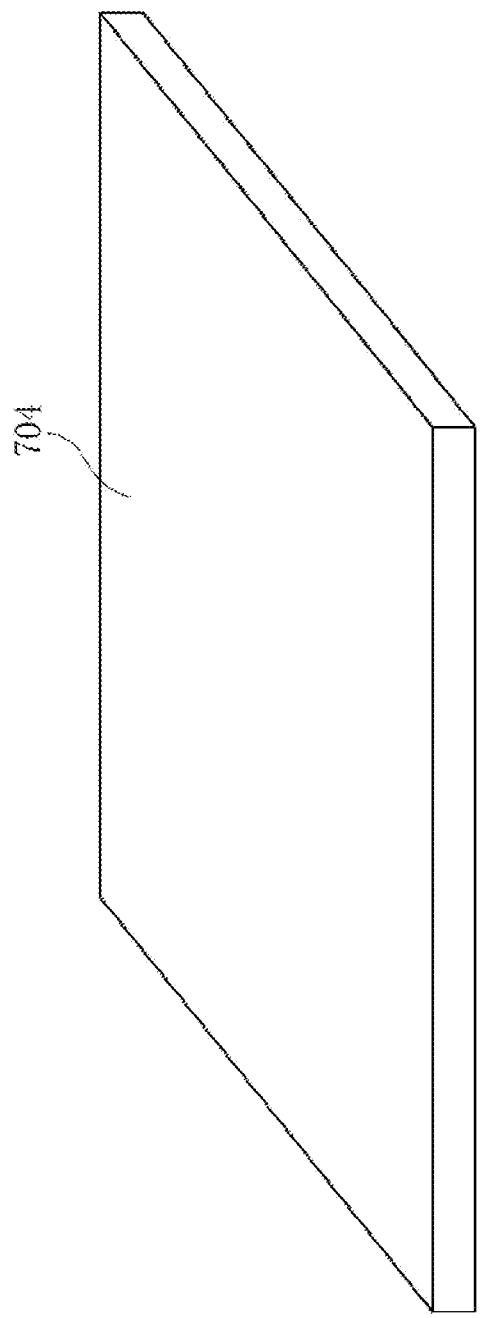
FIG. 28 is a perspective view illustrating a process of a method of manufacturing the chip resistor according to the second embodiment of the present disclosure.
Figure 29:
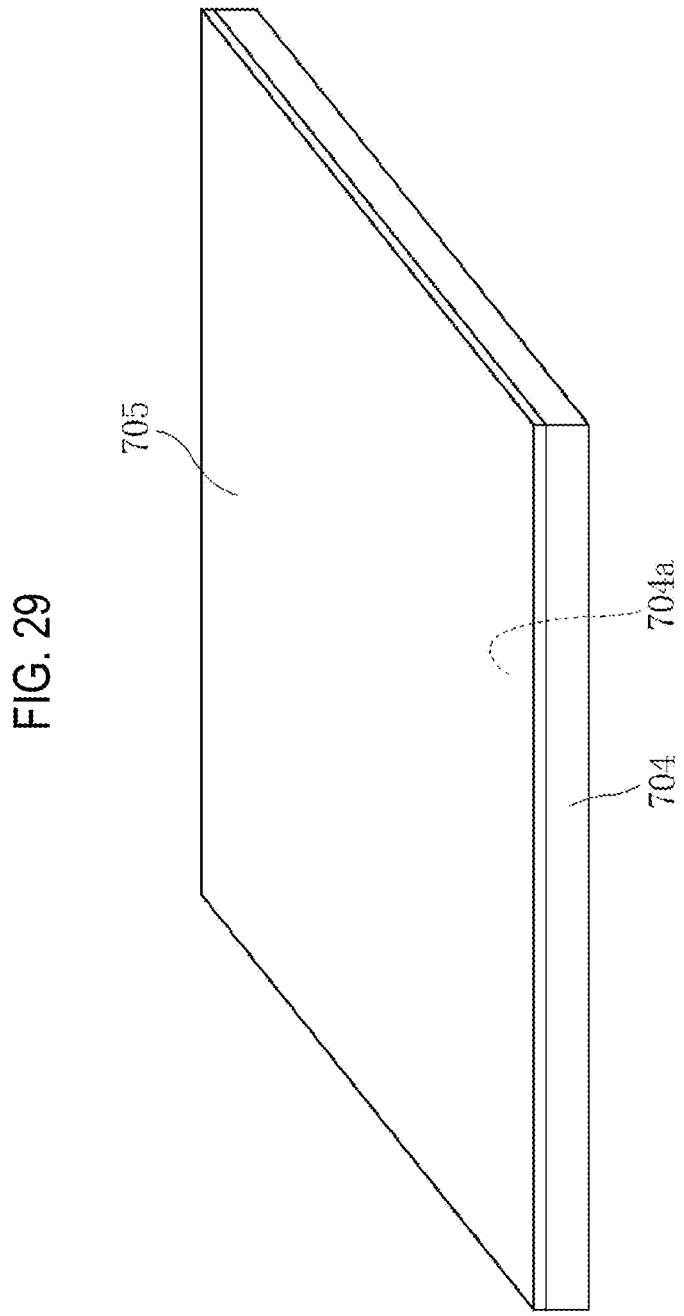
FIG. 29 is a perspective view illustrating a process subsequent to the process illustrated in FIG. 28.
Figure 30:
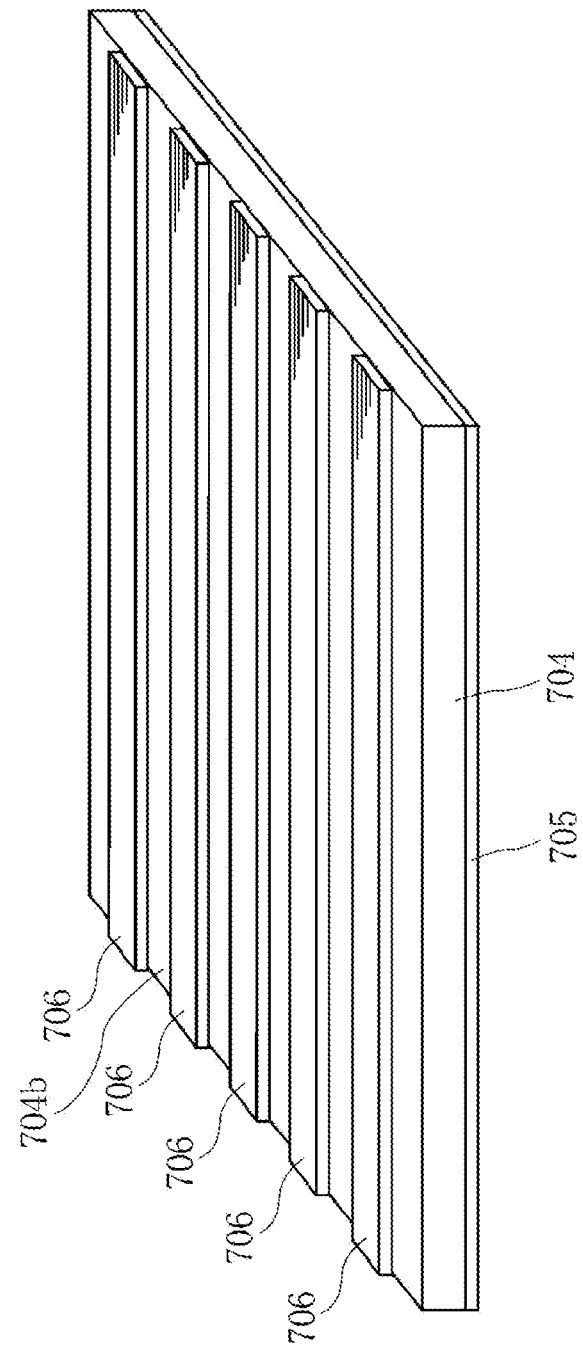
FIG. 30 is a perspective view illustrating a process subsequent to the process illustrated in FIG. 29.

First, as illustrated in FIG. 28, a resistance body member 704 is prepared. The resistance body member 704 has a plate shape with vertical and horizontal sizes sufficient to form the plurality of resistance bodies 1 and the thickness thereof is uniform. Next, as illustrated in FIG. 29, an insulating layer 705 is formed on an entire top surface 704a of the resistance body member 704. The insulating layer 705 is formed by printing a resin that is a material of the insulating layer 705 in the form of a thick film. Then, a resistor assembly is formed. In order to form the resistor assembly, first, as illustrated in FIG. 30, the resistance body member 704 are reversed and then a plurality of insulating layers 706 are formed to be arranged on an upward surface 704b of the resistance body member 704 in the form of stripes. The plurality of insulating layers 706 are formed by thick film printing by using the same resin and device as those used for forming the insulating layer 705.

Figure 31:
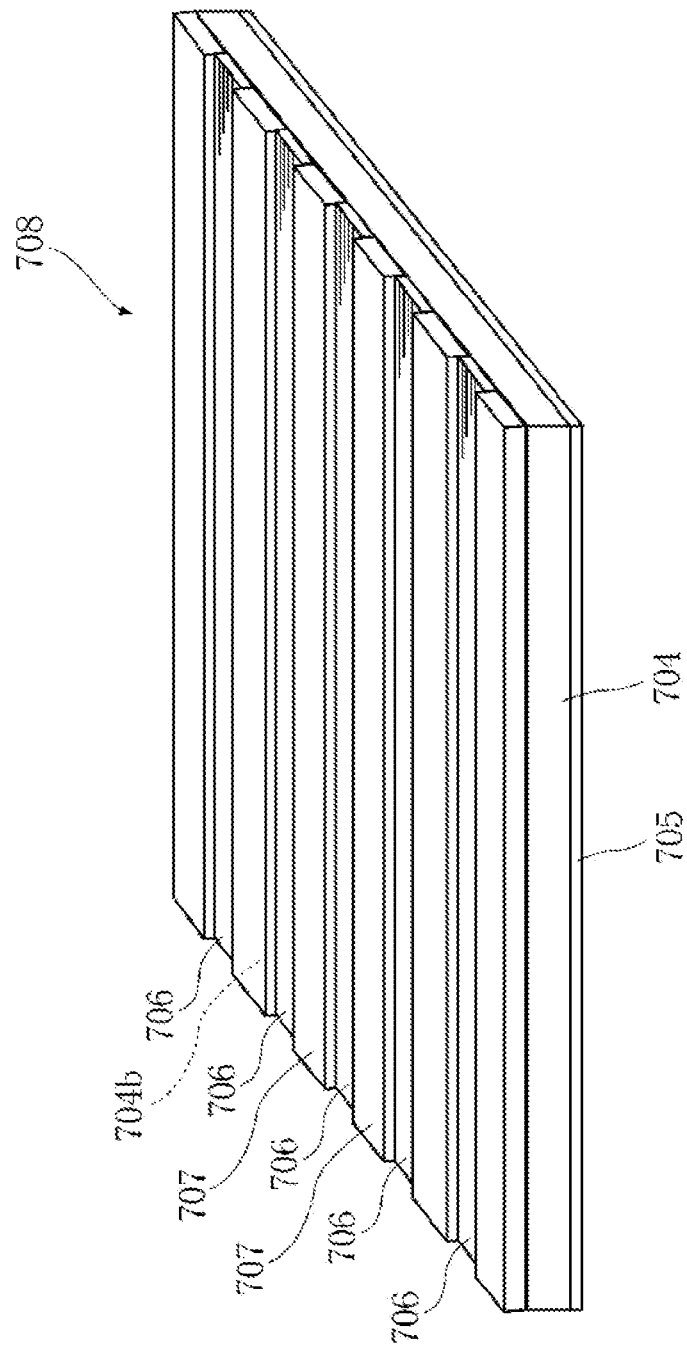
FIG. 31 is a perspective view illustrating a process subsequent to the process illustrated in FIG. 30.

Next, as illustrated in FIG. 31, conductive members 707 are formed in regions where the insulating layers 706 are not formed among the plurality of insulating layers 706 on the surface 704b of the resistance body member 704. The conductive members 707 are formed, for example, by performing Cu plating. By performing the Cu plating, it is possible to prevent gaps from being generated between the conductive members 707 and the insulating layers 706 and to uniformly form the conductive member 707 in the region between the adjacent insulating layers 706. By doing so, a resistor assembly 708 is formed.

Figure 32:
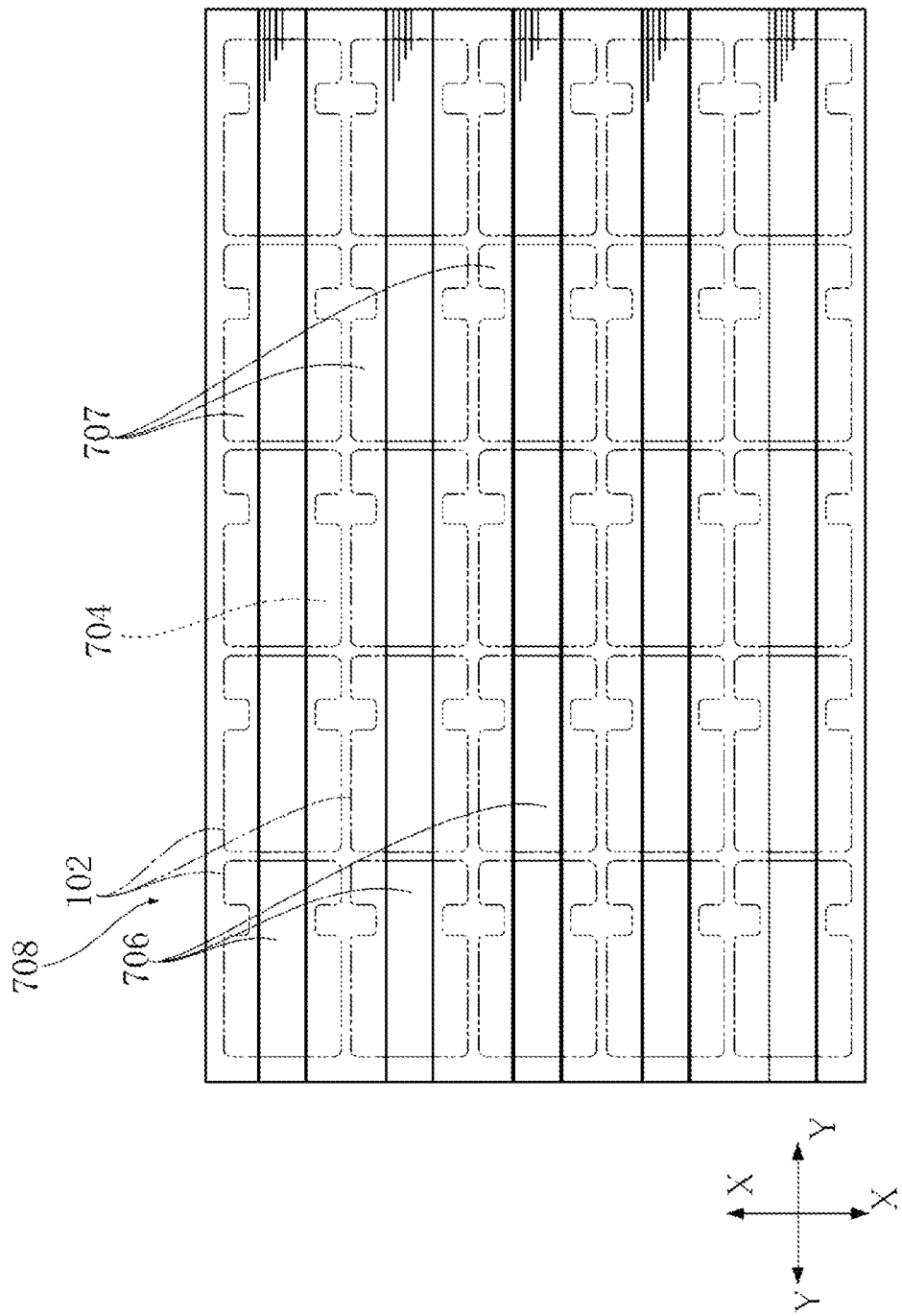
FIG. 32 is a plan view illustrating a process subsequent to the process illustrated in FIG. 31.
Figure 33:
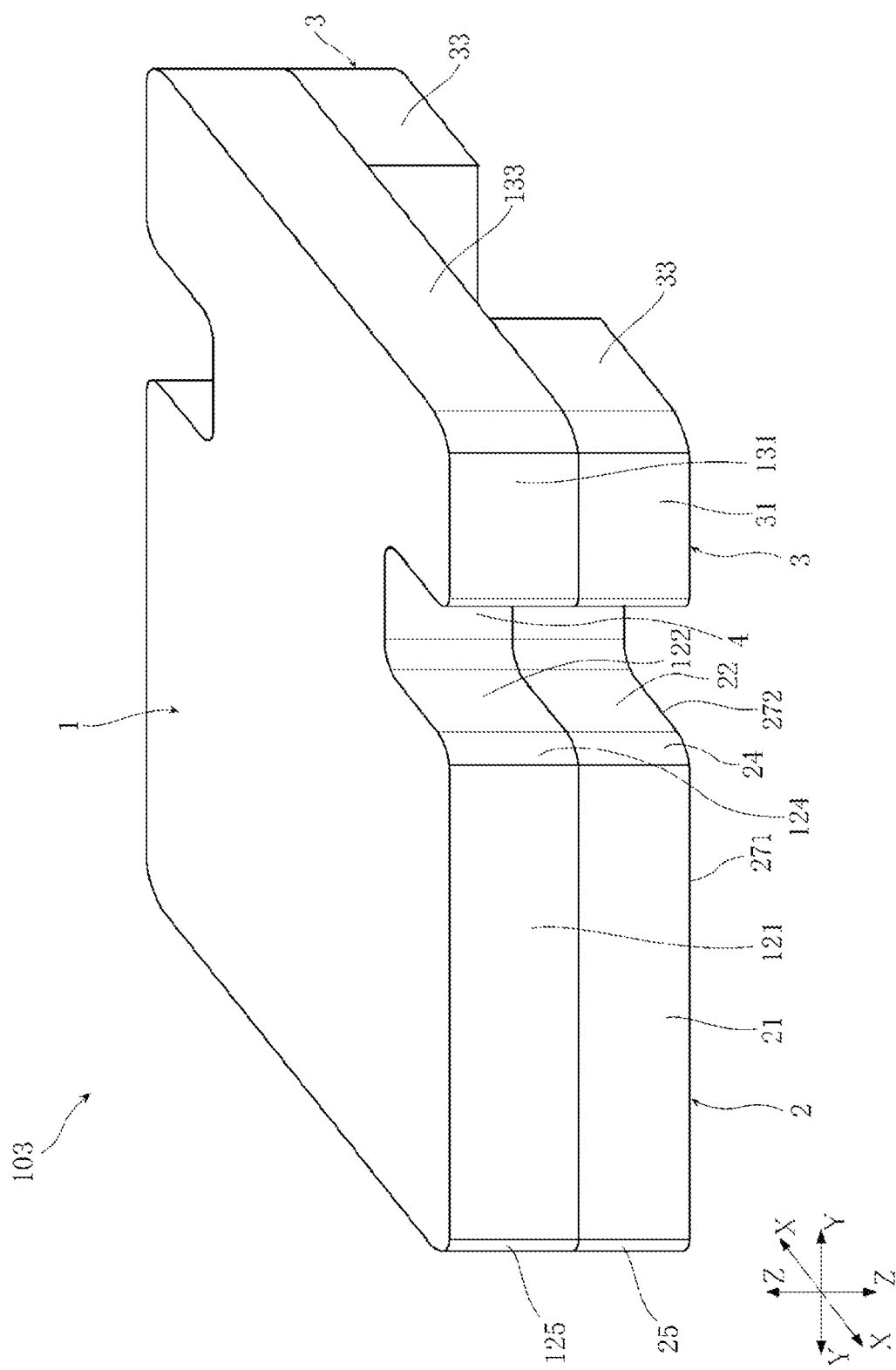
FIG. 33 is a perspective view of a chip resistor according to a third embodiment of the present disclosure.
Figure 34:
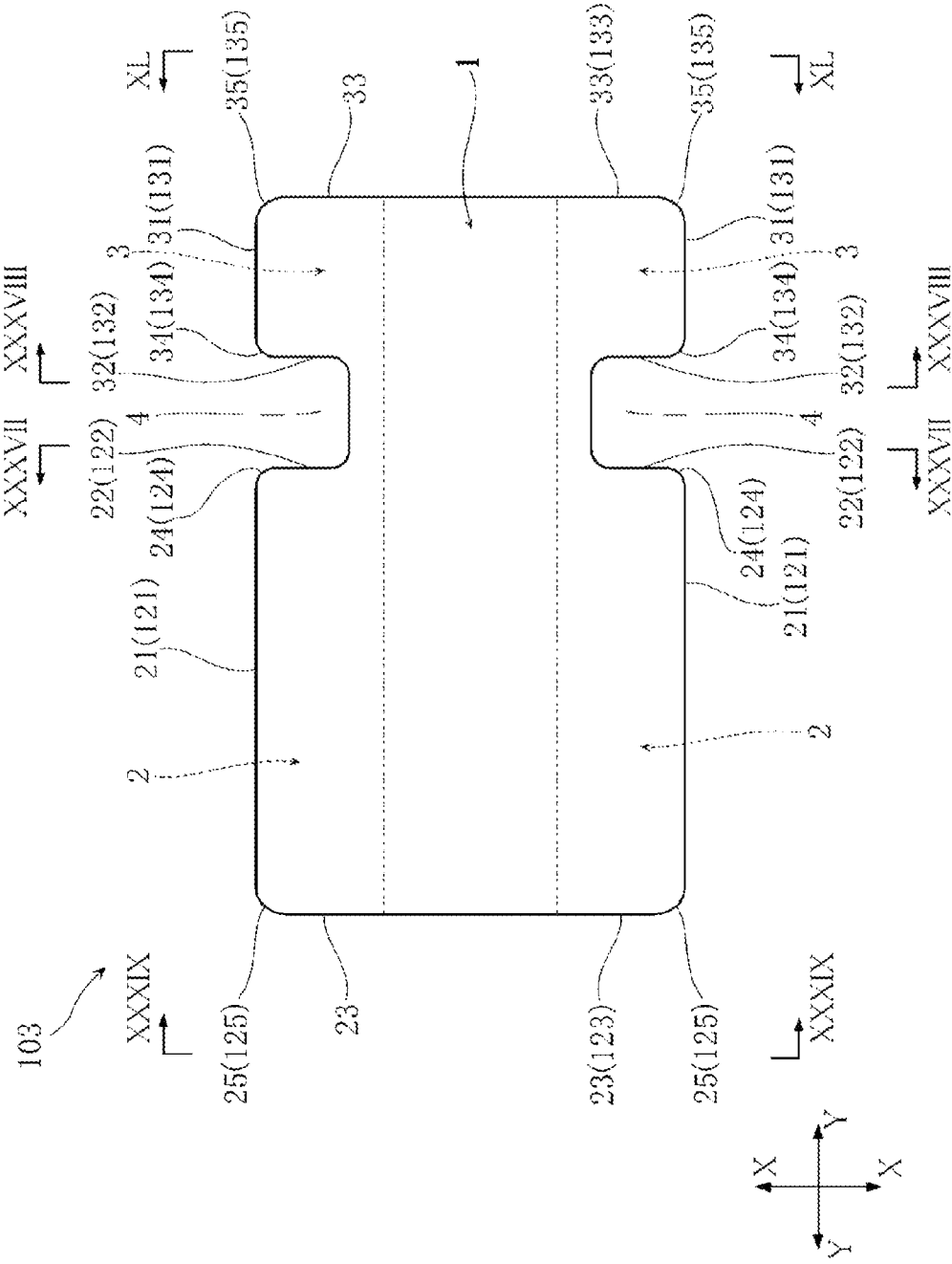
FIG. 34 is a plan view of the chip resistor illustrated in FIG. 33.

Next, as illustrated in FIG. 32, the resistor assembly 708 is collectively divided into the plurality of chip resistors 102 by punching. In FIG. 32, regions that will become the chip resistors 102 in the resistor assembly 703 are indicated by two point chain lines. For example, 25 chip resistors 102 may be obtained from one resistor assembly 708. In order to divide the resistor assembly 708 into the plurality of chip resistors 102, a punching mold (not shown) having a shape corresponding to that of the chip resistors 102 that are indicated by two point chain lines in FIG. 32 is used. A recess having a shape corresponding to that of the concave portion 4 of the chip resistor 102 is formed in the punching mold. The resistor assembly 708 is punched by the punching mold in an outward direction of a plane of FIG. 32. Here, corner portions of the punching mold may be properly rounded. The curved surfaces 24 and 25 of the main electrode 2, the curved surfaces 34 and 35 of the sub-electrode 3, and the curved surfaces 124, 125, 134, and 135 of the resistance body 1 as described above are formed by punching the resistor assembly 708. These curved surfaces 24, 25, 34, 35, 124, 125, 134, and 135 are formed to correspond to the rounded corners of the punching mold. In addition, in the main electrode 2 and the sub-electrode 3, the side surfaces 121, 122, 123, 131, 132, and 133 having the fracture pattern surfaces 141, 142, 143, 151, 152, and 153 in the resistance body 1 are formed by punching the resistor assembly 708. In this manner, the plurality of chip resistors 101 may be manufactured. Further, when the fracture pattern surfaces 141, 142, 143, 151, 152, and 153 are formed, the fractured portions of the resistance body 1 are stretched in a punching direction of the punching mold. Therefore, the end edge stretch portion 160 illustrated in FIG. 45 is formed.

In the present embodiment, when the chip resistors 102 are manufactured, the resistor assembly 708 is divided into the chip resistors 102 each including the four electrodes (the pair of main electrodes 2 and the pair of sub-electrodes 3) by punching. The main electrodes 2 and the sub-electrodes 3 adjacent to each other in the Y direction with the concave portions 4 recessed in the X direction interposed therebetween are formed from the plate-shaped resistor assembly 708 by punching. Since the chip resistors 102 are manufactured by punching as described above, the degree of precision in the dimension of the chip resistor 102, when viewed from a plane, is defined by the degree of precision in the dimension of the punching mold. In the method according to the present embodiment, when the resistor assembly 708 is punched, a punching mold in which the respective parts have desired degrees of precision in dimensions may be used. A punching mold having the recess corresponding to the concave portion 4 of the chip resistor 102 is used so that it is possible to reduce errors in the dimensions of the main electrodes 2 and the sub-electrodes 3 in the directions X and Y. When it is possible to reduce the errors in the dimensions of the main electrodes 2 and the sub-electrodes 3 in the directions X and Y, it is possible to obtain the chip resistor 101 in which the resistance value of the resistance body 1 sandwiched between each of the pair of main electrodes 2 and each of the pair of sub-electrodes 3 is a desired value.

In the chip resistor 102 according to the present embodiment, the same effect as that of the chip resistor 101 of the foregoing embodiment may be obtained.

Next, a third embodiment of the present disclosure will be described.

FIGS. 33 to 40 illustrate a chip resistor 103 according to a third embodiment of the present disclosure. The chip resistor 103 according to the third embodiment is mainly different from the chip resistor 101 in that it has the main electrodes 2 and the sub-electrodes 3 provided on the bottom surface 12 (the surface in the Z direction) of the resistance body 1. The resistance body 1 has the same plane size as that of the chip resistor 103.

The resistance body 1 has side surfaces 121, 122, 123, 131, 132, and 133 and curved surfaces 124, 125, 134, and 135. The side surfaces 121 and 131 face toward the X direction. The side surfaces 122 and 132 face toward the Y direction and are positioned to face each other. The side surfaces 123 and 133 face toward the Y direction and are positioned at opposite directions to each other. The side surfaces 121, 122, and 123 are connected to the side surfaces 21, 22, and 23 of the main electrode 2, respectively, and the curved surface 124 is interposed between the side surfaces 121 and 122. The curved surface 125 is interposed between the side surfaces 121 and 123. The curved surfaces 124 and 125 are connected to the curved surfaces 24 and 25 of the main electrode 2, respectively. These curved surfaces 124 and 125 are formed to correspond to the shape of a punching mold which is used when a resistor assembly is divided into the chip resistors 103 by punching, as described later. The side surfaces 131, 132, and 133 are connected to the side surfaces 31, 32, and 33 of the sub-electrode 3, respectively, and the curved surface 134 is interposed between the side surfaces 131 and 132. The curved surface 135 is interposed between the side surfaces 131 and 133. The curved surfaces 134 and 135 are connected to the curved surfaces 34 and 35 of the sub-electrode 3, respectively. These curved surfaces 134 and 135 are formed to correspond to the shape of the punching mold which is used when the resistor assembly is divided into the chip resistors 103 by punching, as described later.

Figure 35:
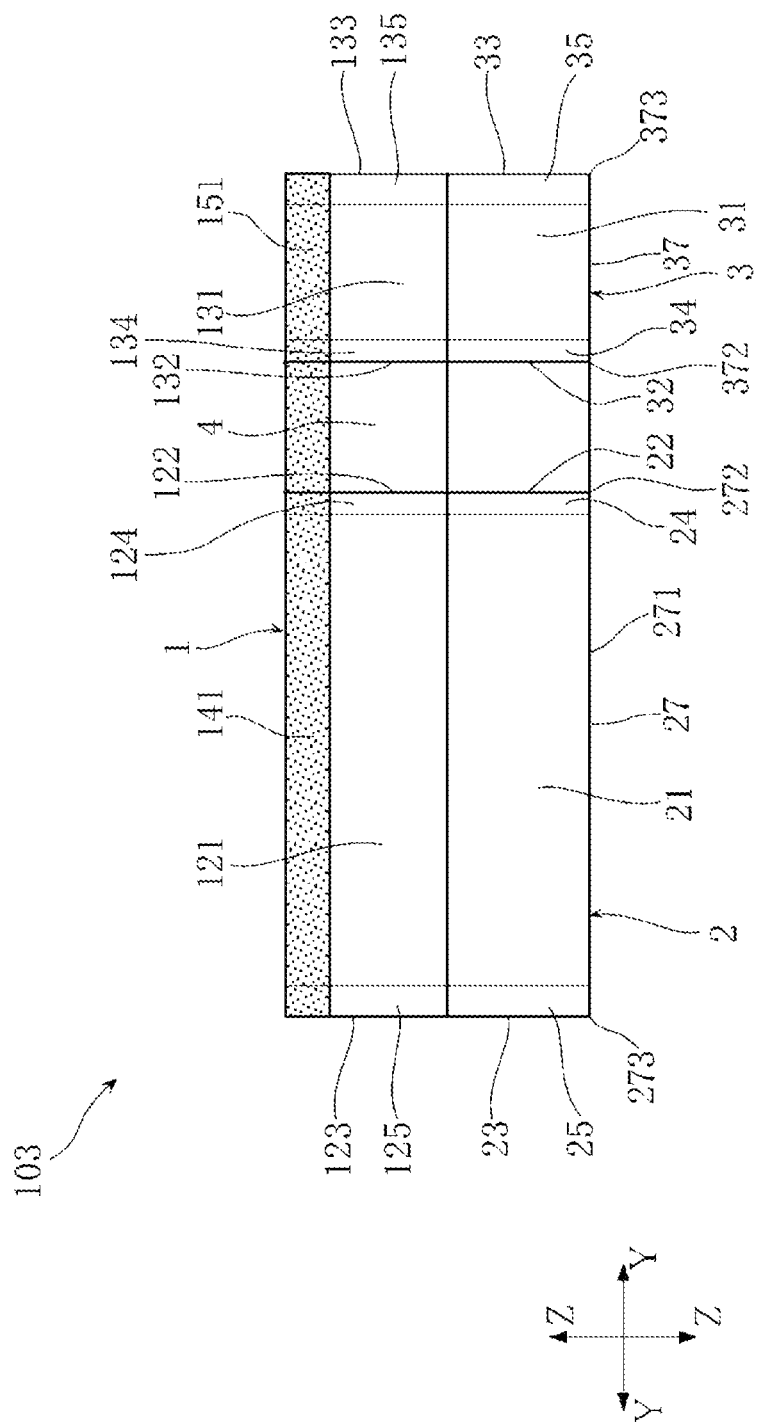
FIG. 35 is a front view of the chip resistor illustrated in FIG. 33.
Figure 36:
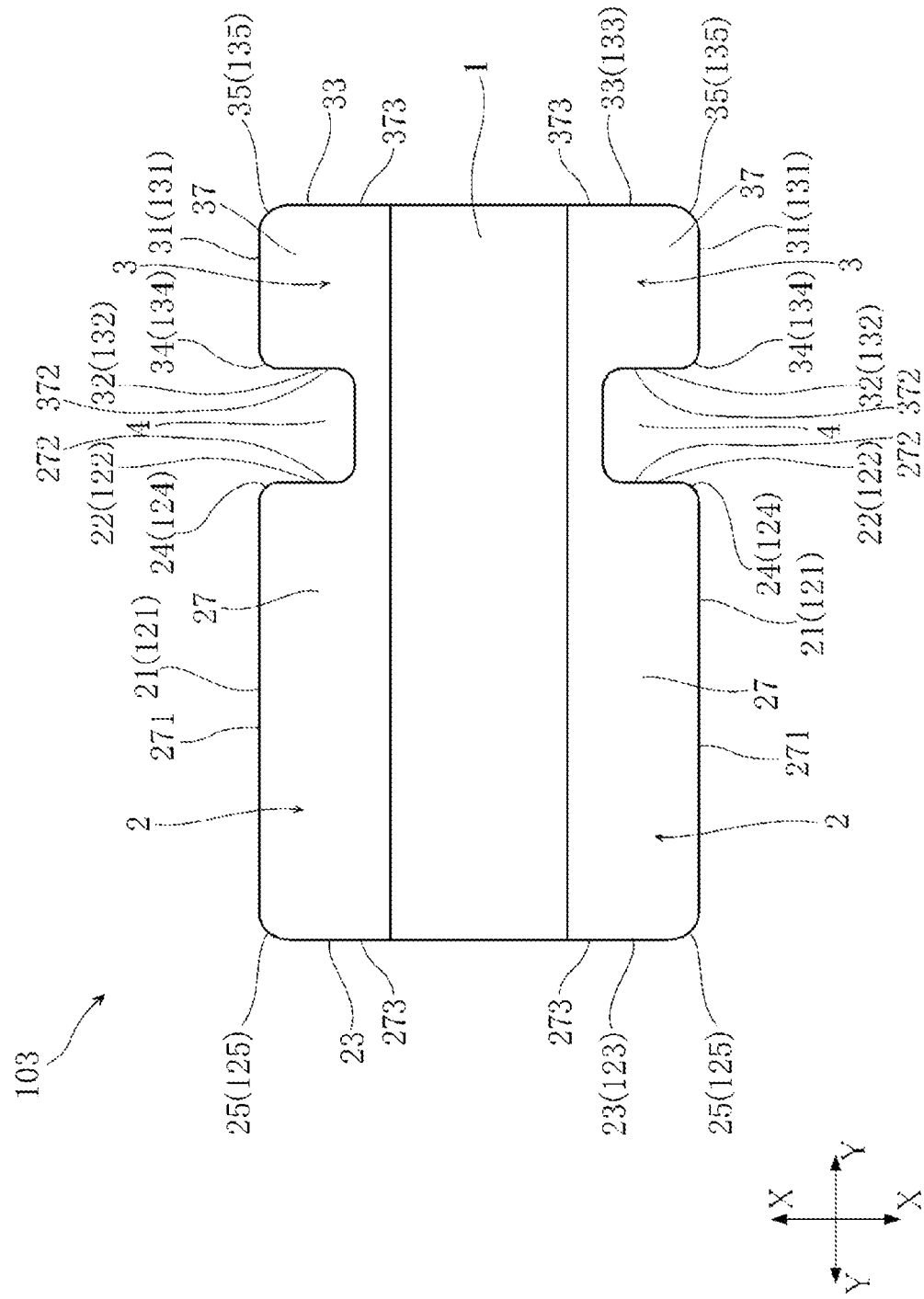
FIG. 36 is a bottom view of the chip resistor illustrated in FIG. 33.
Figure 37:
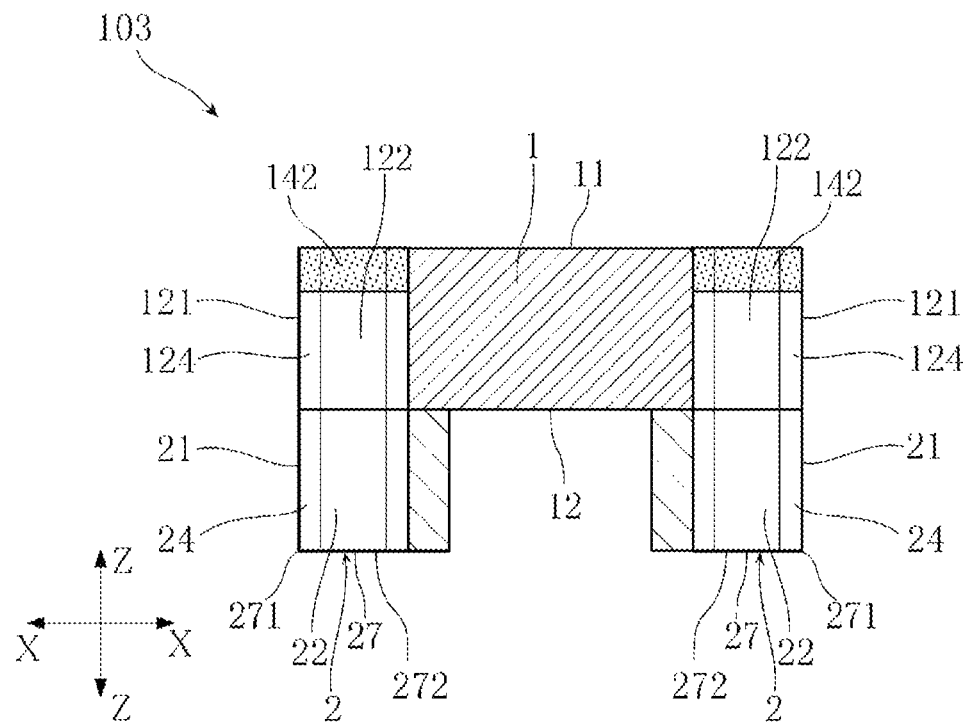
FIG. 37 is a cross-sectional view taken along line XXXVII-XXXVII in FIG. 34.
Figure 38:
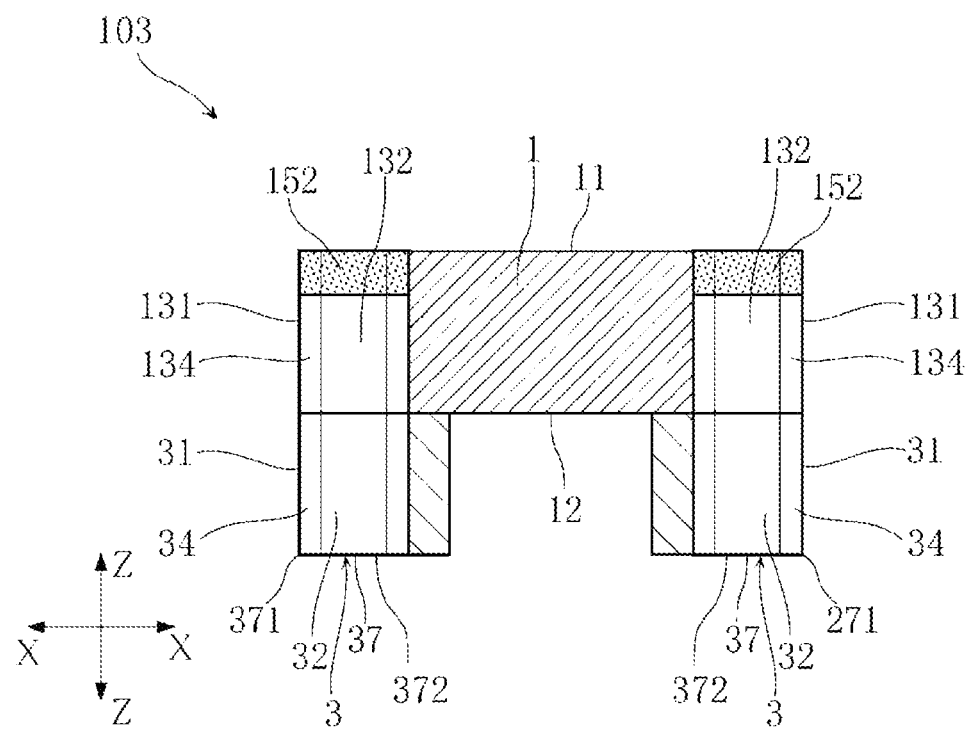
FIG. 38 is a cross-sectional view taken along line XXXVIII-XXXVIII in FIG. 34.
Figure 39:
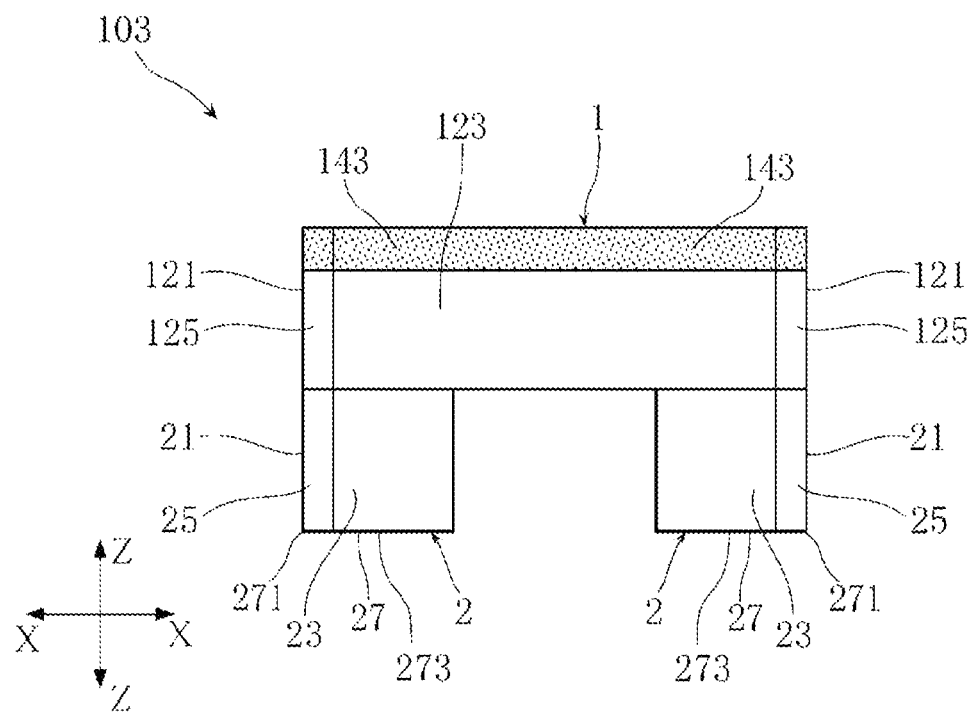
FIG. 39 is a view viewed from arrow XXXIX-XXXIX in FIG. 34.
Figure 40:
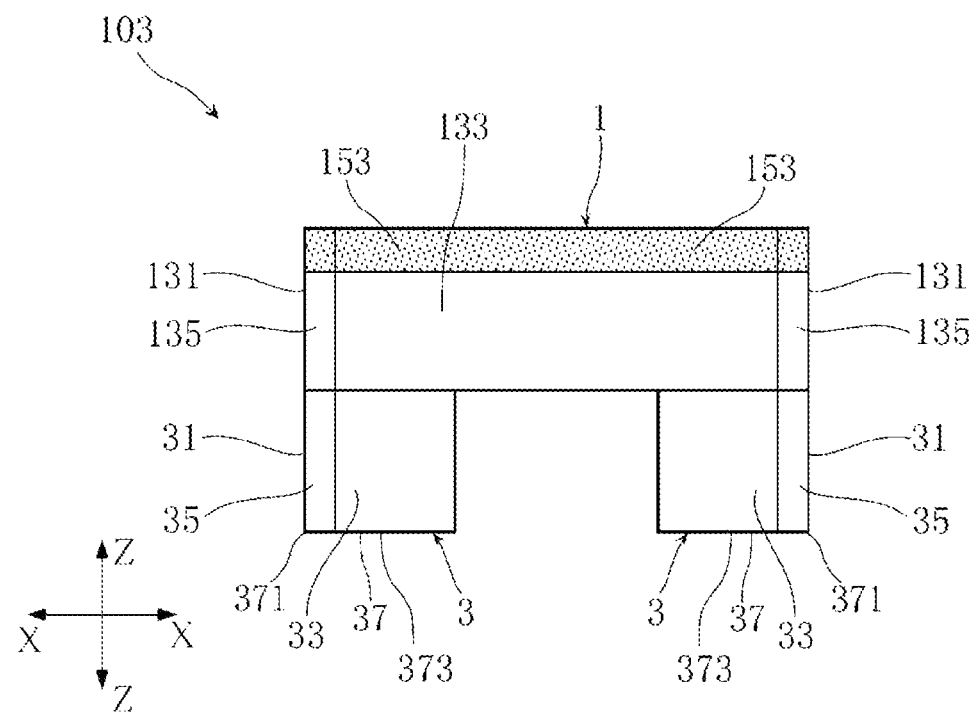
FIG. 40 is a view viewed from arrow XL-XL in FIG. 34.

As illustrated in FIG. 35, the side surfaces 121 and 131 have fracture pattern surfaces 141 and 151. As illustrated in FIG. 37, the side surface 122 has a fracture pattern surface 142. As illustrated in FIG. 39, the side surface 123 has a fracture pattern surface 143. As illustrated in FIG. 38, the side surface 132 has a fracture pattern surface 152. As illustrated in FIG. 40, the side surface 133 has a fracture pattern surface 153.

Next, a method of manufacturing the chip resistor 103 will be described.

Figure 41:
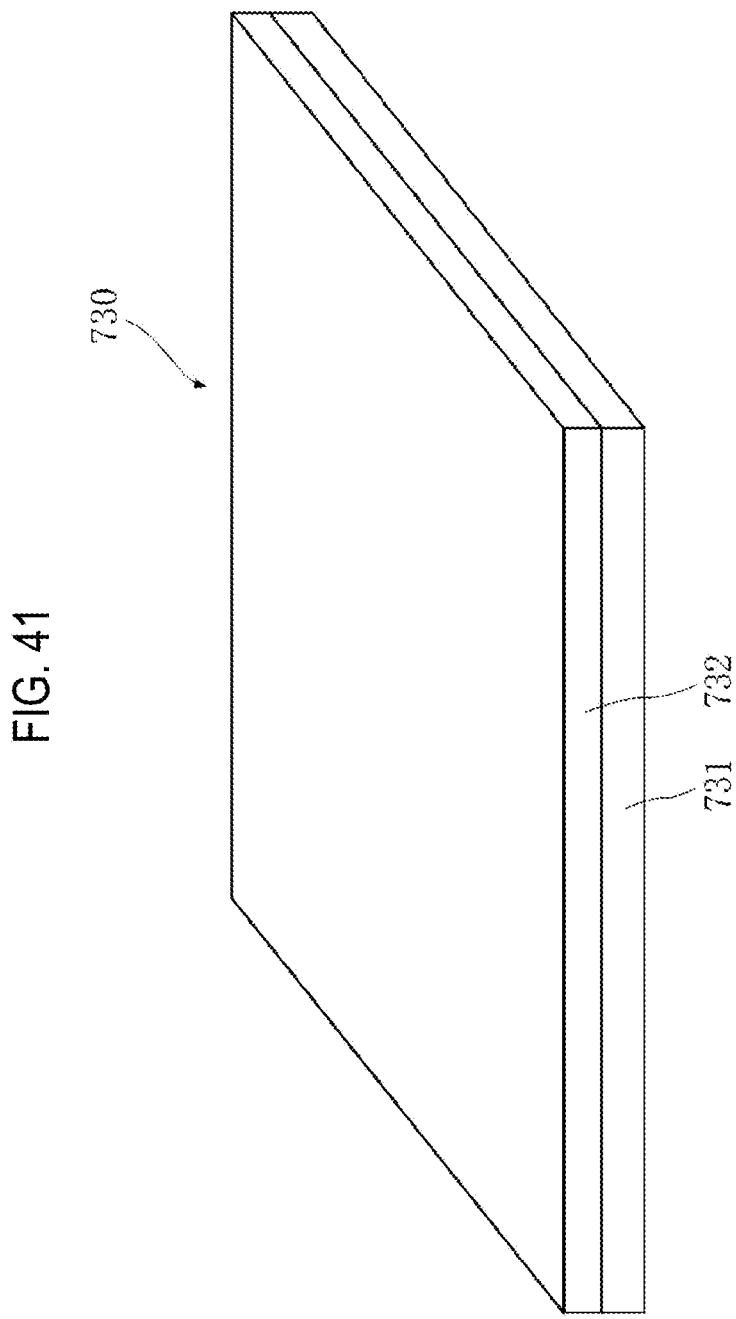
FIG. 41 is a perspective view illustrating a process of a method of manufacturing the chip resistor according to the third embodiment of the present disclosure.
Figure 42:
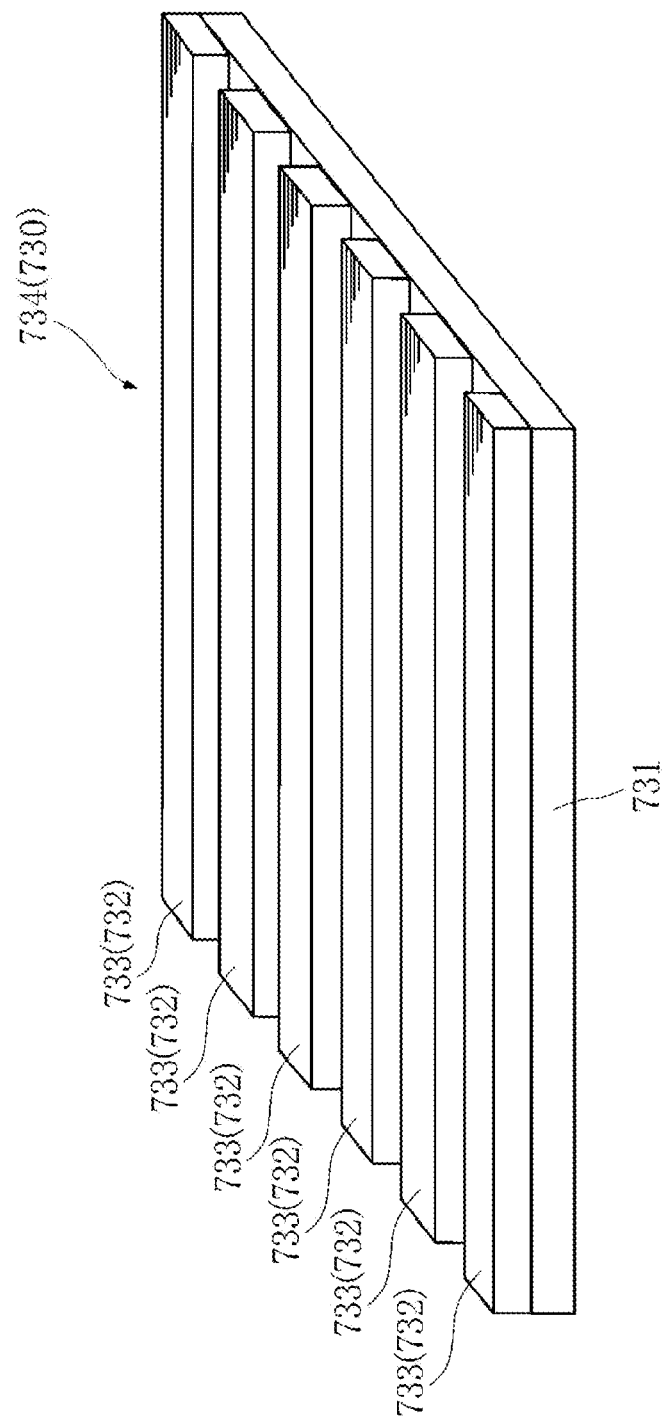
FIG. 42 is a perspective view illustrating a process subsequent to the process illustrated in FIG. 41.

First, as illustrated in FIG. 41, a clad material 730 (a bonded body) in which a plate-shaped resistance material 731 and a plate-shaped conductive material 732 are bonded to each other is prepared. The clad material 730 is an elongated rectangular-shaped plate having vertical and horizontal sizes sufficient to form the plurality of resistance bodies 1. Next, as illustrated in FIG. 42, parts of the conductive material 732 are removed to form grooves extended in a longitudinal direction (i.e., the Y direction). Cross-section of the groove is rectangular shape. The conductive material 732 is removed in a plurality of positions at regular intervals in a width direction (i.e., the X direction) of the clad material 730. Therefore, a resistor assembly 734 having conductive members 733 separated from each other in the width direction is formed.

Figure 43:
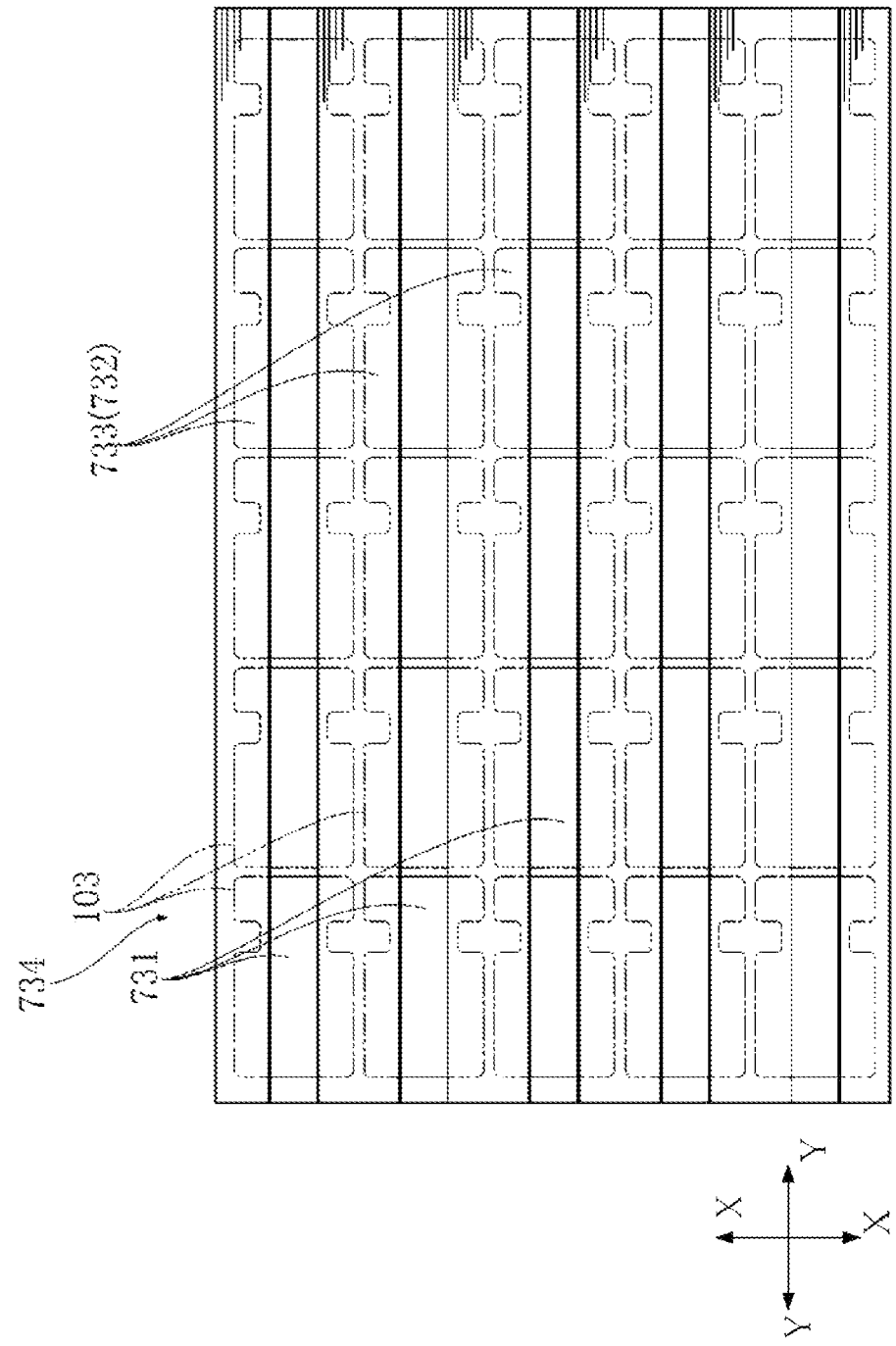
FIG. 43 is a plan view illustrating a process subsequent to the process illustrated in FIG. 42.

Next, as illustrated in FIG. 43, the resistor assembly 734 is collectively divided into the plurality of chip resistors 103 by punching. In FIG. 43, regions that will become the chip resistors 103 in the resistor assembly 734 are indicated by two point chain lines. For example, 25 chip resistors 103 may be obtained from one resistor assembly 734. In order to divide the resistor assembly 734 into the plurality of chip resistors 103, a punching mold (not shown) having a shape corresponding to that of the chip resistors 103 that are indicated by two point chain lines in FIG. 43 is used. A recess having a shape corresponding to that of the concave portion 4 of the chip resistor 103 is formed in the punching mold. The resistor assembly 734 is punched by the punching mold in an outward direction of a plane of FIG. 43. Here, corner portions of the punching mold may be properly rounded. The curved surfaces 24 and 25 of the main electrode 2, the curved surfaces 34 and 35 of the sub-electrode 3, and the curved surfaces 124, 125, 134, and 135 of the resistance body 1 as described above are formed by punching the resistor assembly 734. These curved surfaces 24, 25, 34, 35, 124, 125, 134, and 135 are formed to correspond to the rounded corners of the punching mold. In addition, in the main electrode 2 and the sub-electrode 3, the side surfaces 121, 122, 123, 131, 132, and 133 having the fracture pattern surfaces 141, 142, 143, 151, 152, and 153 in the resistance body 1 are formed by punching the resistor assembly 734. In this manner, the plurality of chip resistors 103 may be manufactured.

In the present embodiment, when the chip resistors 103 are manufactured, the resistor assembly 734 is divided into the chip resistors 103 each including the four electrodes (the pair of main electrodes 2 and the pair of sub-electrodes 3) by punching. The main electrodes 2 and the sub-electrodes 3 adjacent to each other in the Y direction with the concave portions 4 recessed in the X direction interposed therebetween are formed from the plate-shaped resistor assembly 734 by punching. Since the chip resistors 103 are manufactured by punching as described above, the degree of precision in the dimension of the chip resistor 103, when viewed from a plane, is defined by the degree of precision in the dimension of the punching mold. In the method according to the present embodiment, when the resistor assembly 734 is punched, a punching mold in which the respective parts have desired degrees of precision in dimensions may be used. A punching mold having the recess corresponding to the concave portion 4 of the chip resistor 103 is used so that it is possible to reduce errors in the dimensions of the main electrodes 2 and the sub-electrodes 3 in the X and Y directions. When it is possible to reduce the errors in the dimensions of the main electrodes 2 and the sub-electrodes 3 in the X and Y directions, it is possible to obtain the chip resistor 103 in which the resistance value of the resistance body 1 sandwiched between each of the pair of main electrodes 2 and each of the pair of sub-electrodes 3 is a desired value.

In the chip resistor 103 according to the present embodiment, the same effect as that of the chip resistor 101 of the foregoing embodiment may be obtained.

Figure 46:
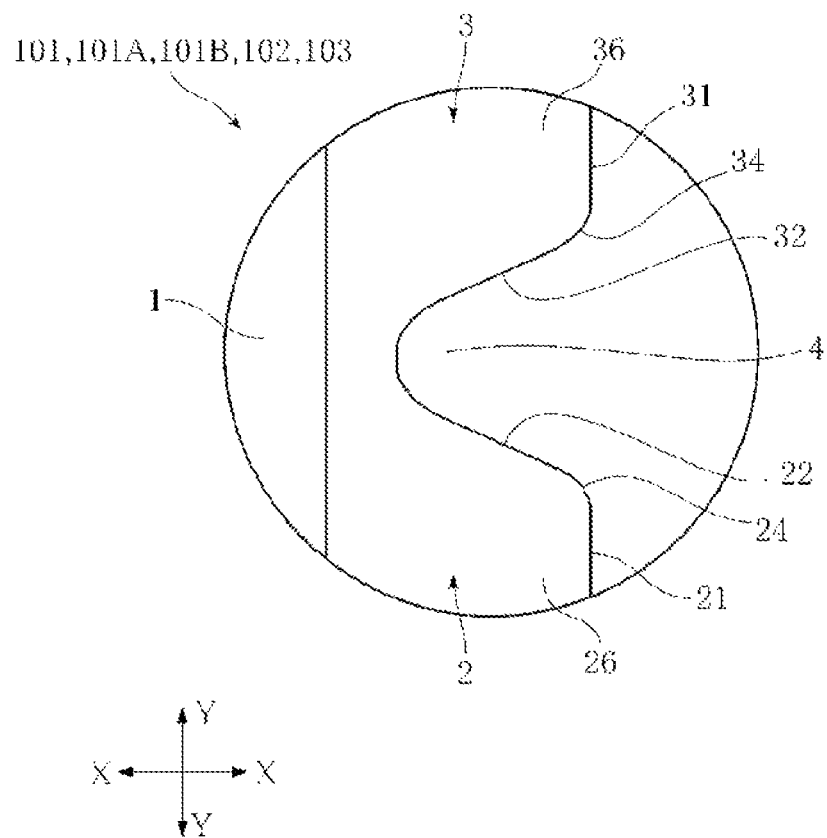
FIG. 46 is an enlarged plan view of a portion of a modification of a concave part of the chip resistor according to the present disclosure.

FIG. 46 illustrates a modification of the concave portion 4 of the chip resistors 101, 101A, 101B, 102, and 103. In the present modification, the concave portion 4 has a substantially triangular shape. The side surface 22 and the side surface 32 are inclined to each other and a distance between them becomes smaller from an outside (the right in the drawing) in the X direction toward an inside (the left in the drawing) in the X direction. The above-mentioned effect can also be expected by this modification.

Figure 47:
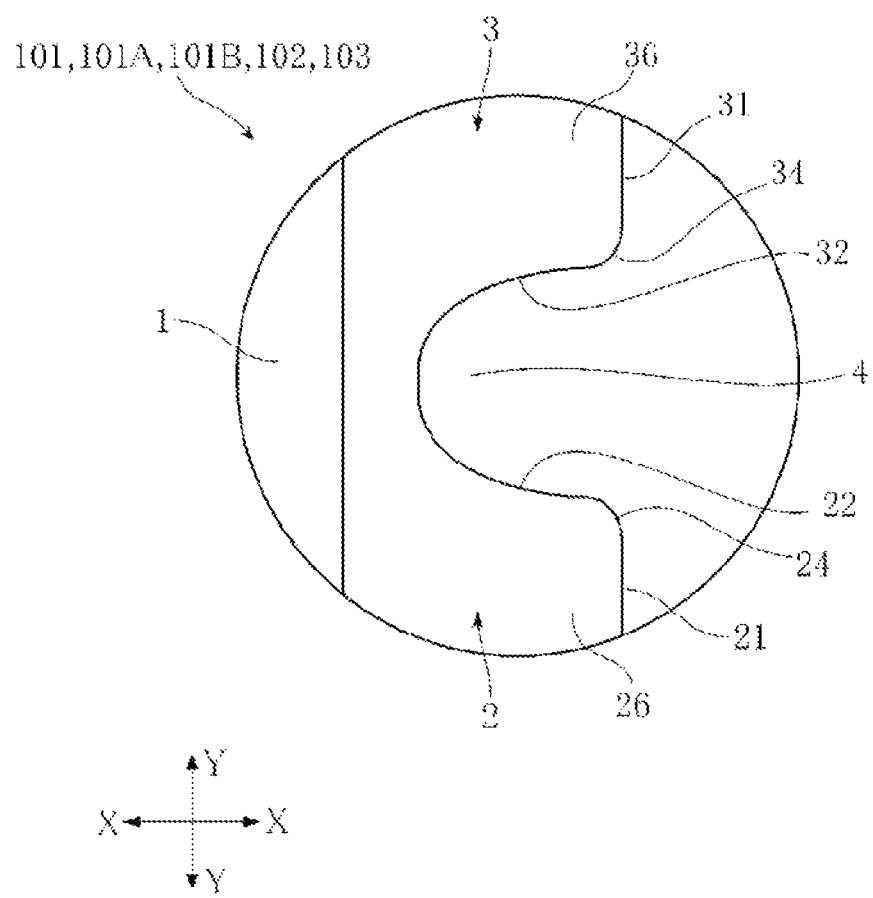
FIG. 47 is an enlarged plan view of a portion of another modification of the concave part of the chip resistor according to the present disclosure.

FIG. 47 illustrates a modification of the concave portion 4 of the chip resistors 101, 101A, 101B, 102, and 103. In the present modification, the concave portion 4 has a substantial semi-elliptical shape or a substantially semicircle shape. The side surface 22 and the side surface 32 are all curved surfaces and a distance between them becomes smaller from an outside (the right in the drawing) in the X direction toward an inside (the left in the drawing) in the X direction. The above-mentioned effect can also be expected by this modification.

The scope of the present disclosure is not limited to the embodiments described above. The specific configuration of each of the parts of the present disclosure may be design-changed in various ways.

In the foregoing embodiments, a description is made of the case in which the resistor assembly is collectively divided into the plurality of chip resistors by punching, but the punching method is not limited thereto. For example, the resistor assembly may be divided into resistors one by one by repeatedly performing the punching operation of the resistor assembly by using a punching mold having a shape corresponding to one chip resistor.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a chip resistor, comprising:
    forming a resistor assembly in which a conductive member including portions separated from each other in a first direction is provided in a resistance body member; and
    dividing the resistor assembly into chip resistors, each of the chip resistors including:
        a chip-shaped resistance body formed by a part of the resistance body member;
        a pair of main electrodes formed by a part of the conductive member and separated from each other in the first direction; and a pair of sub-electrodes formed by a part of the conductive member, separated from each other in the first direction, and adjacent to the main electrodes in a second direction perpendicular to the first direction with concave portions recessed in the first direction interposed therebetween, by punching.

2. The method of claim 1, wherein the punching is performed by using a punching mold having a shape corresponding to a shape of the chip resistor.

3. The method of claim 2, wherein a recess having a shape corresponding to a shape of the concave portions is formed in the punching mold.

4. The method of claim 2, wherein the resistor assembly is punched by the punching mold in a direction perpendicular to both the first and second directions.

5. The method of claim 2, wherein the punching mold has rounded corner portions.

6. The method of claim 1, wherein the resistance body member has at least one elongated resistance body plate extended in the second direction,
wherein the conductive member has a plurality of elongated conductive plates, each being extended in the second direction, and
wherein the forming a resistor assembly comprises:
arranging the plurality of elongated conductive plates to be separated from each other in the first direction perpendicular to the second direction in which the elongated conductive plates are extended;
arranging the elongated resistance body plate in a position sandwiched between adjacent two elongated conductive plates among the plurality of elongated conductive plates; and
bonding the elongated resistance body plate and the adjacent elongated conductive plates.

7. The method of claim 6, wherein the elongated resistance body plate and the adjacent elongated conductive plates are bonded to each other by welding.

8. The method of claim 7, wherein the welding is a high energy beam welding including an electron beam welding and a laser beam welding.

9. The method of claim 6, wherein a thickness of the elongated resistance body plate is smaller than that of the elongated conductive plate.

10. The method of claim 6, wherein a cross-section of each of the elongated conductive plates has a rectangular shape.

11. The method of claim 6, wherein a cross-section of the elongated resistance body plate has a rectangular shape.

12. The method of claim 1, wherein the resistance body member is plate-shaped, and
wherein the forming a resistor assembly includes:
forming an insulating layer extended in the second direction on one surface of the resistance body member; and
forming the conductive member in a region where the insulating layer is not formed on the one surface by performing plating.

13. The method of claim 12, wherein the plating includes a Cu plating.

14. The method of claim 1, wherein the forming a resistor assembly comprises:
preparing a bonded body in which a plate-shaped resistance material and a plate-shaped conductive material are bonded to each other; and
removing a part of the conductive material to form the conductive member including the portions separated from each other in the first direction.

15. The method of claim 14, wherein a cross-section of the conductive member has a rectangular shape.

16. The method of claim 1, wherein, in the dividing the resistor assembly into chip resistors, the resistor assembly is collectively divided into the plurality of chip resistors.

* * * * *